(12) United States Patent
Mikado et al.

(10) Patent No.: US 6,242,079 B1
(45) Date of Patent: Jun. 5, 2001

(54) PRINTED WIRING BOARD AND METHOD FOR MANUFACTURING THE SAME

(75) Inventors: Yukinobu Mikado, Ohgaki; Yasuji Hiramatsu; Honchin En, both of Gifu, all of (JP)

(73) Assignee: Ibiden Co., Ltd., Ohgaki (JP)

( * ) Notice: Subject to any disclaimer, the term of this patent is extended or adjusted under 35 U.S.C. 154(b) by 0 days.

(21) Appl. No.: 09/445,511

(22) PCT Filed: Jul. 8, 1998

(86) PCT No.: PCT/IB98/01047

§ 371 Date: Dec. 8, 1999

§ 102(e) Date: Dec. 8, 1999

(87) PCT Pub. No.: WO99/03316

PCT Pub. Date: Jan. 21, 1999

(30) Foreign Application Priority Data

Jul. 8, 1997 (JP) .................................................. 9-196351

(51) Int. Cl.[7] ........................................................ B32B 5/00
(52) U.S. Cl. ........................ 428/209; 428/901; 174/250; 174/261
(58) Field of Search ..................................... 428/209, 901; 174/250, 261

(56) References Cited

U.S. PATENT DOCUMENTS 6,010,768 * 1/2000 Yasue et al. ........................ 428/209

FOREIGN PATENT DOCUMENTS

| 59-101356 | 6/1984 | (JP) . |
| 3-3298 | 1/1991 | (JP) . |
| 4-125986 | 4/1992 | (JP) . |
| B2-4-55555 | 9/1992 | (JP) . |
| 4-277690 | 10/1992 | (JP) . |
| 7-292483 | 11/1995 | (JP) . |
| 7-297547 | 11/1995 | (JP) . |
| 9-36551 | 2/1997 | (JP) . |
| 9-130050 | 5/1997 | (JP) . |

* cited by examiner

*Primary Examiner*—Cathy Lam
(74) *Attorney, Agent, or Firm*—Oliff & Berridge, PLC

(57) ABSTRACT

There is provided a multilayer printed wiring board 52 comprising an underlayer conductor circuit 26, an interlaminar resin insulating layer 37 formed on the underlayer conductor circuit 26, an upper layer conductor circuit 44 formed on the interlaminar resin insulating layer 37 and a via-hole 51 connecting the underlayer conductor circuit 26 to the upperlayer conductor circuit 44. The multilayer printed wiring board according to the invention has a roughened surface 35 by treating the underlayer conductor circuit 24 with an etching solution containing copper(II) complex and an organic acid, wherein the underlayer conductor circuit 26 is connected to the via-hole 51 through the roughened surface 35. In the multilayer printed wiring board according to the invention, the adhesion property between the underlayer. conductor circuit and the interlaminar resin insulating layer and the adhesion property between the underlayer conductor circuit and the via-hole conductor are improved, and the high connection reliability in the via-hole portion is ensured in the heating or the heat cycle.

16 Claims, 25 Drawing Sheets

FIG._1
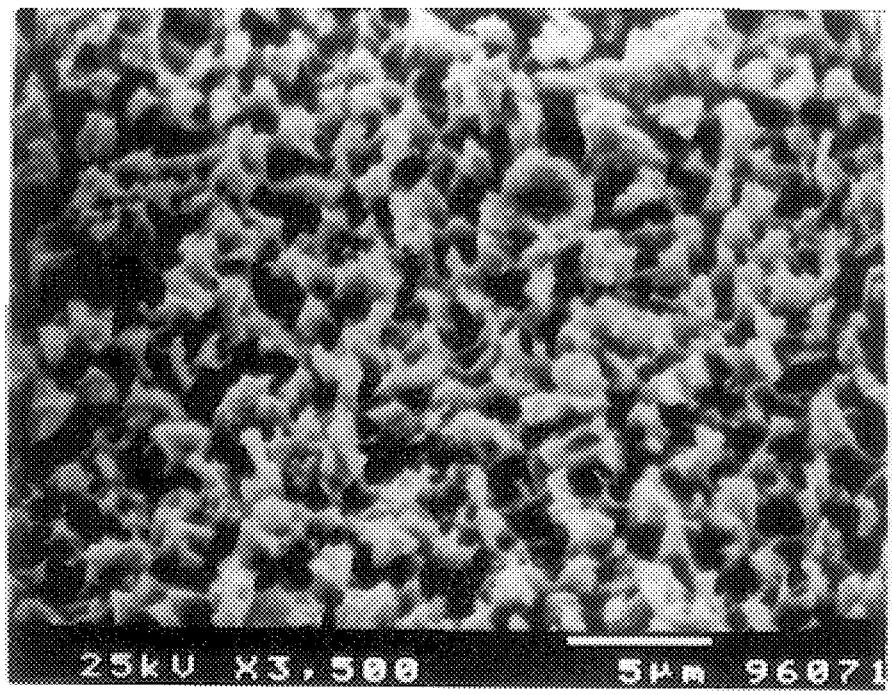
FIG._2
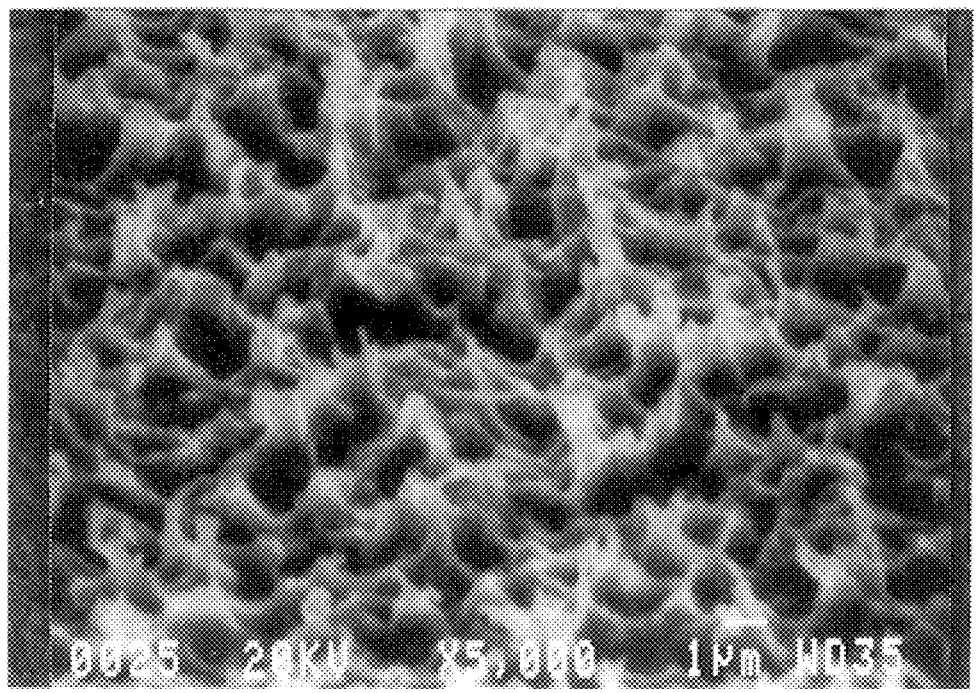

FIG_3
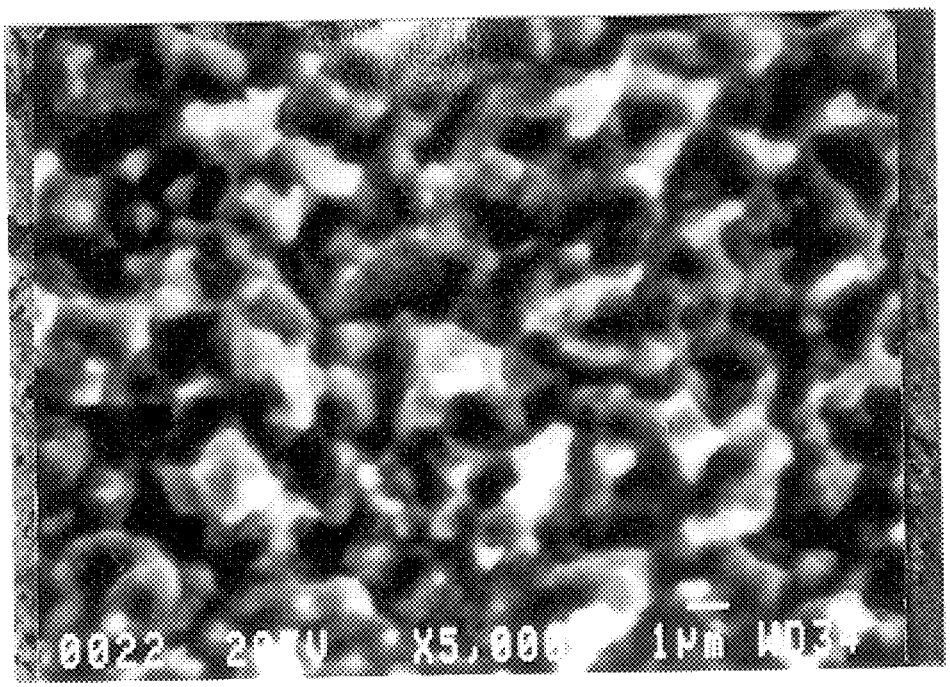

FIG_20
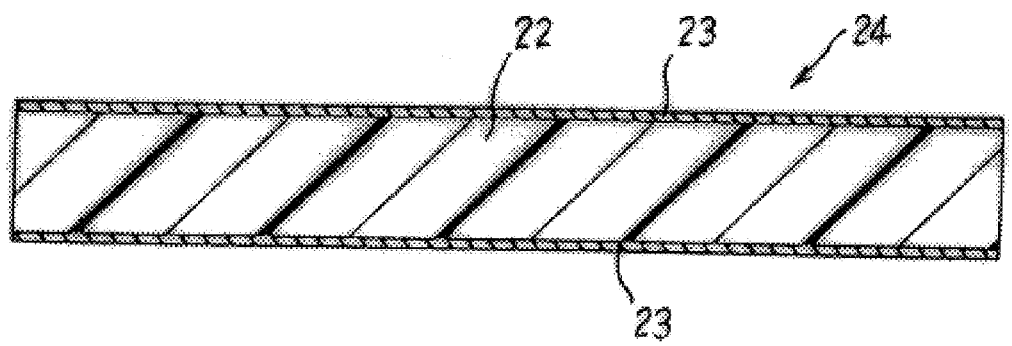
FIG_21
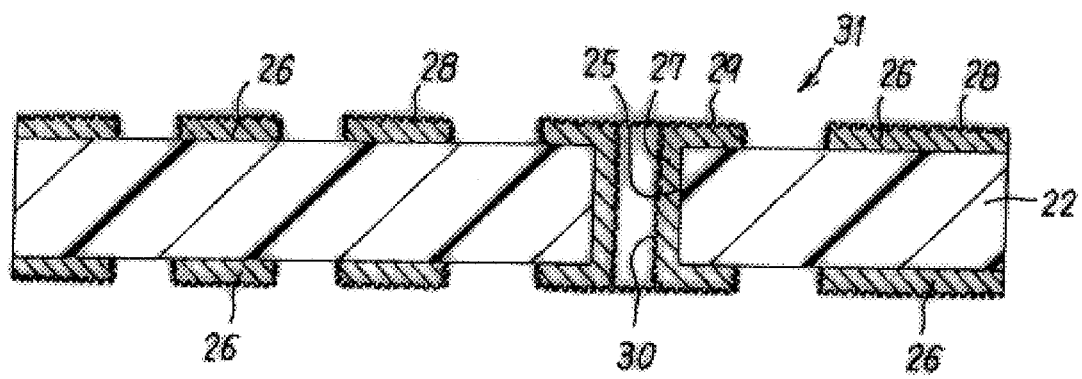
FIG_22
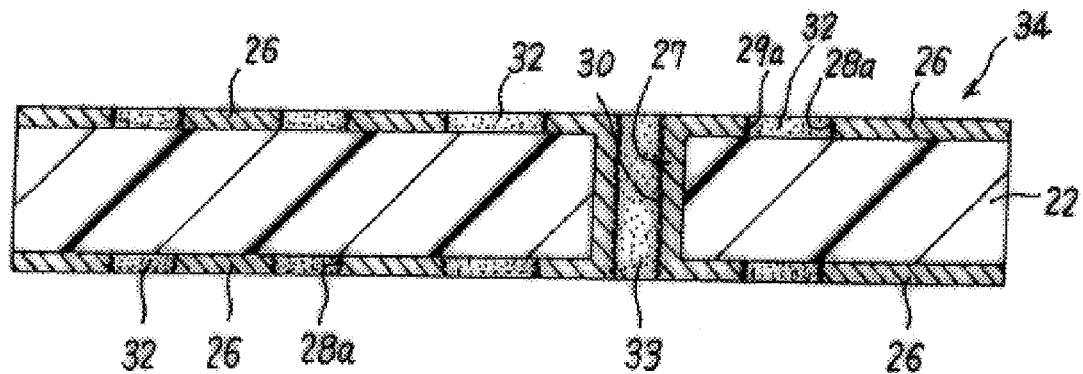

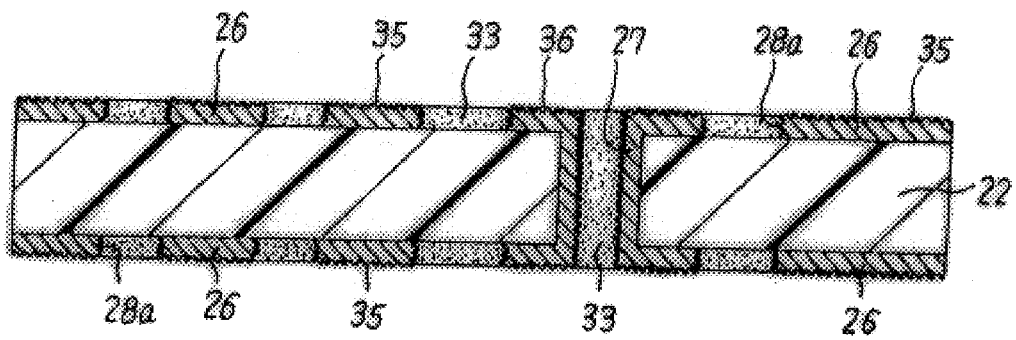
FIG_23
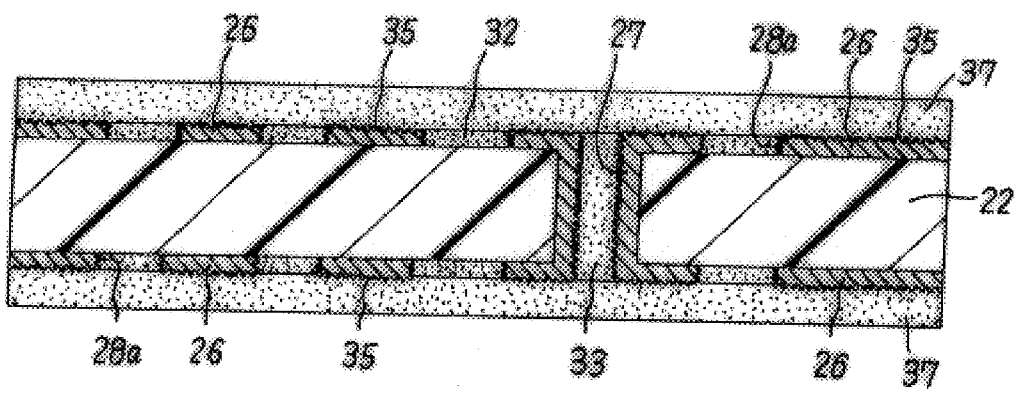
FIG_24
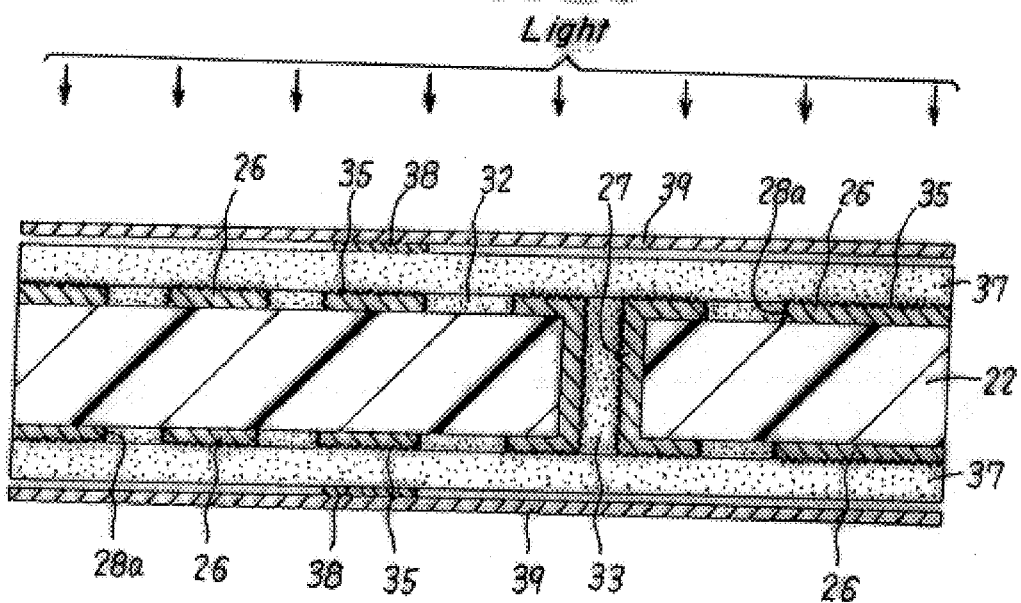
FIG_25

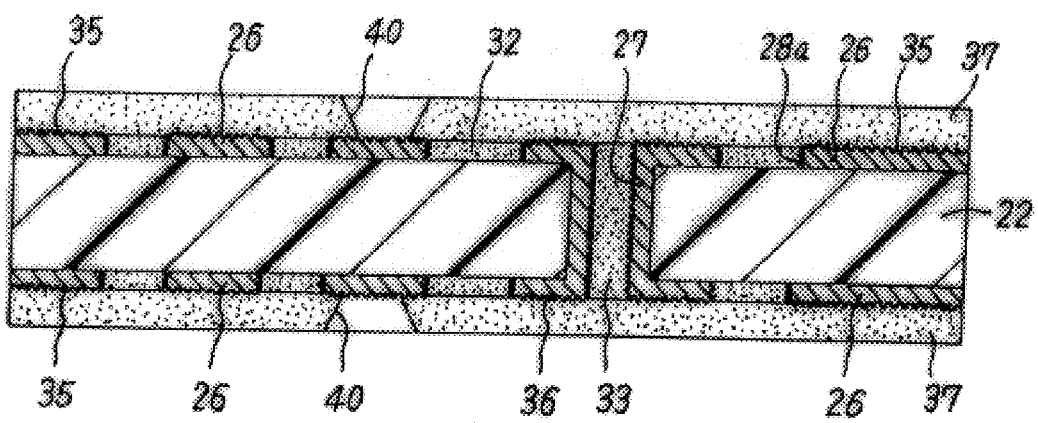
FIG_26
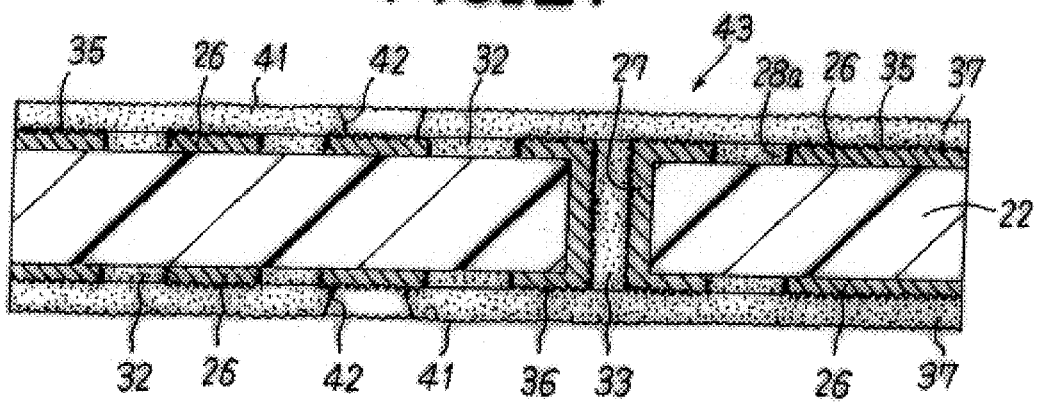
FIG_27
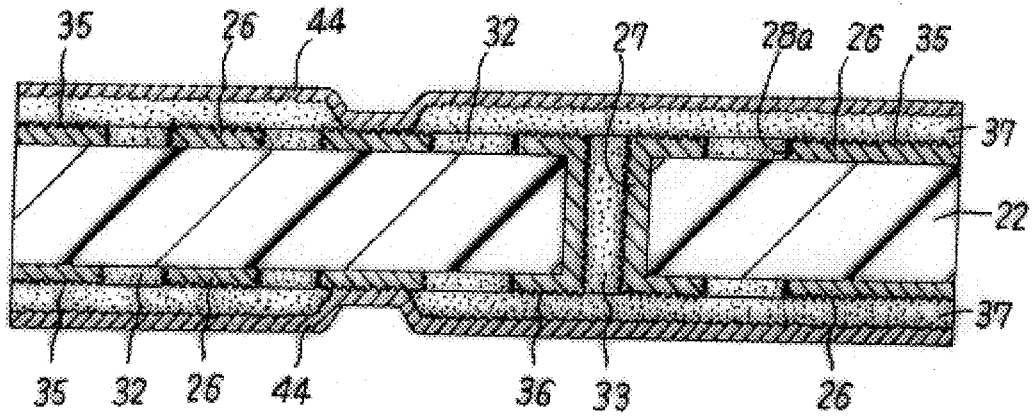
FIG_28

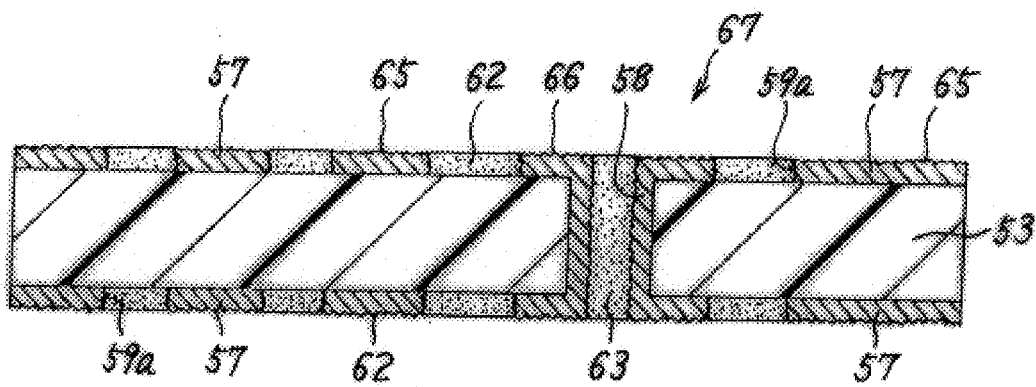
FIG._36
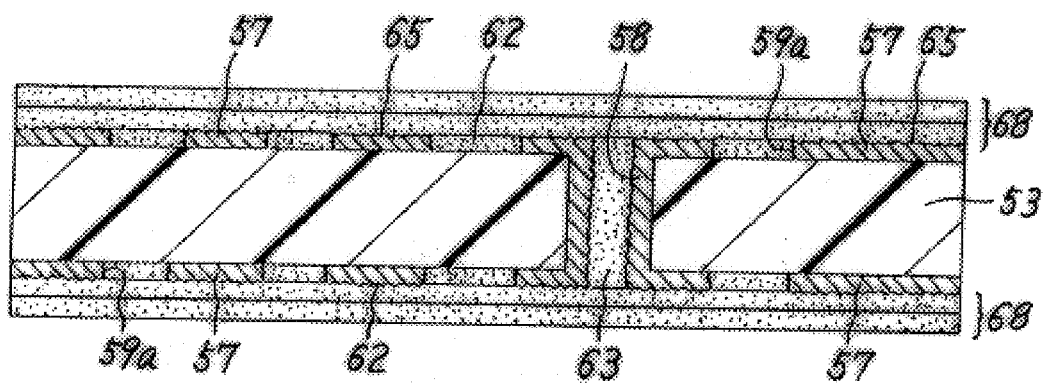
FIG._37
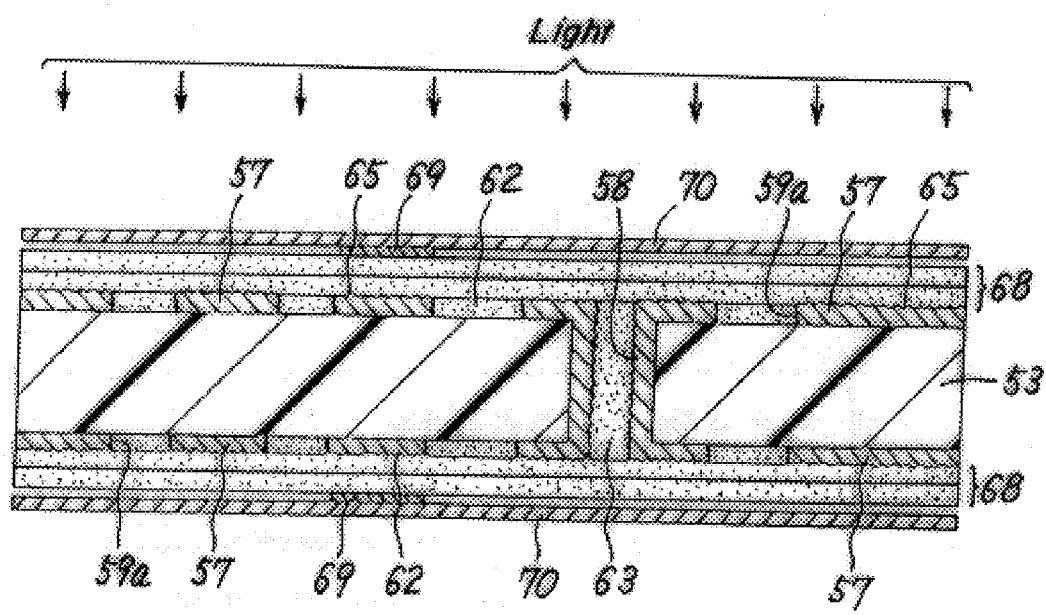
FIG._38

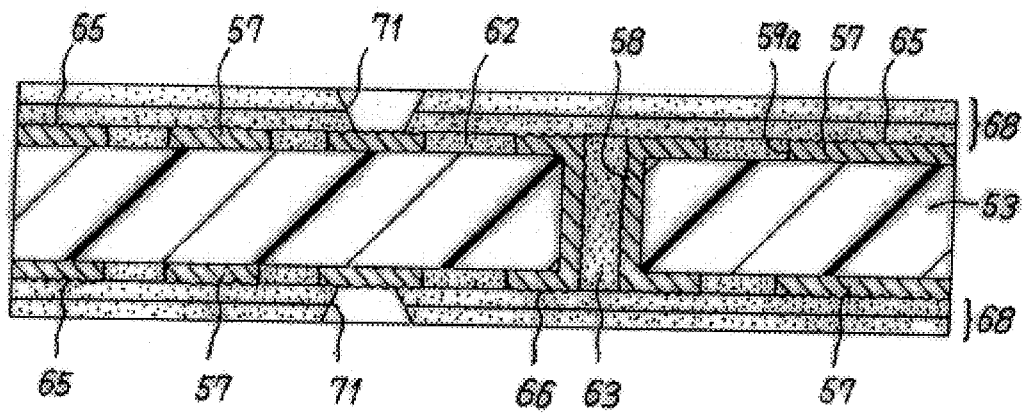
FIG_39
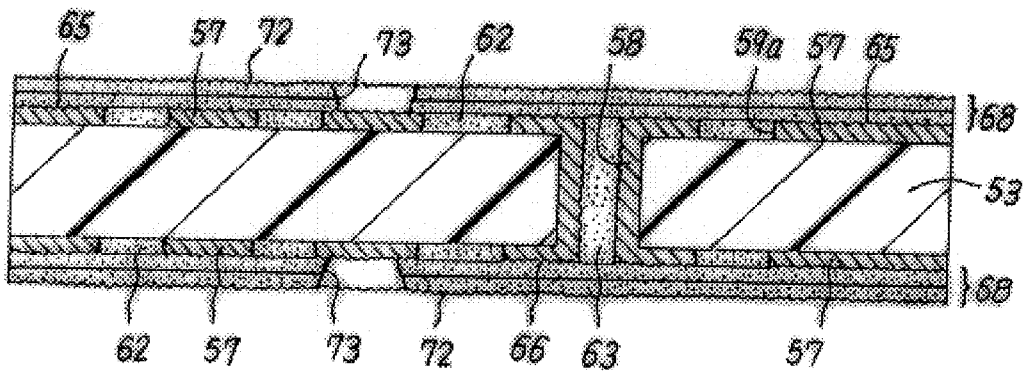
FIG_40
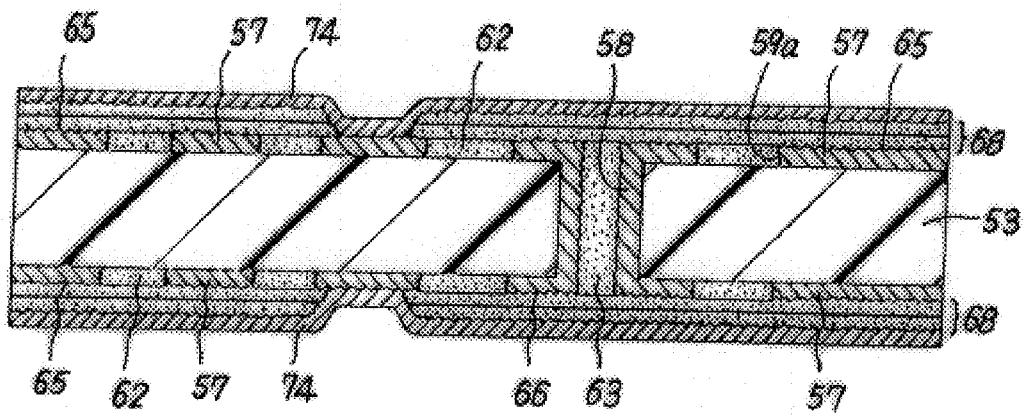
FIG_41

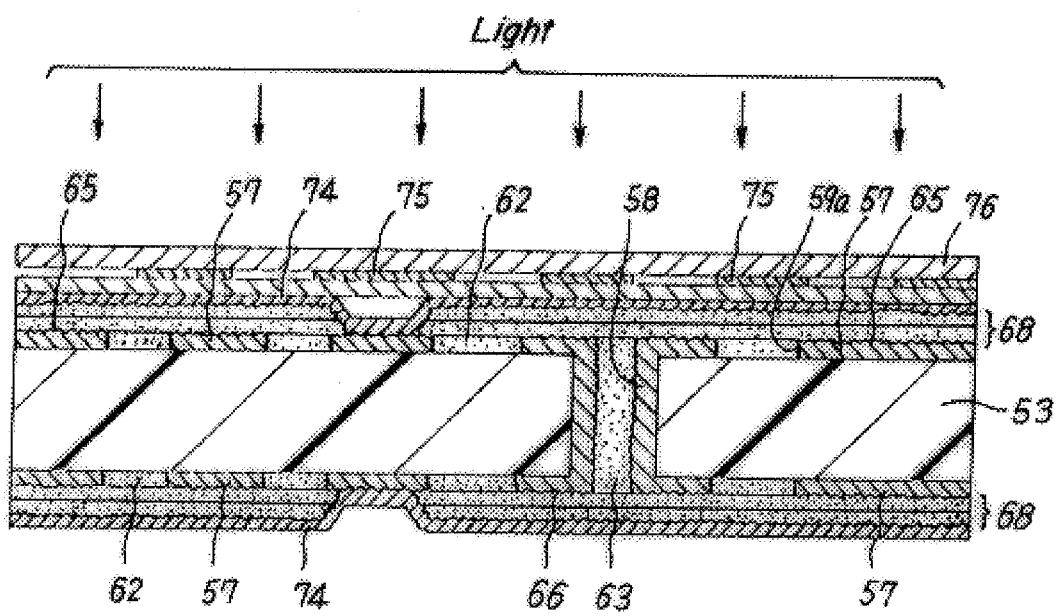
FIG_42
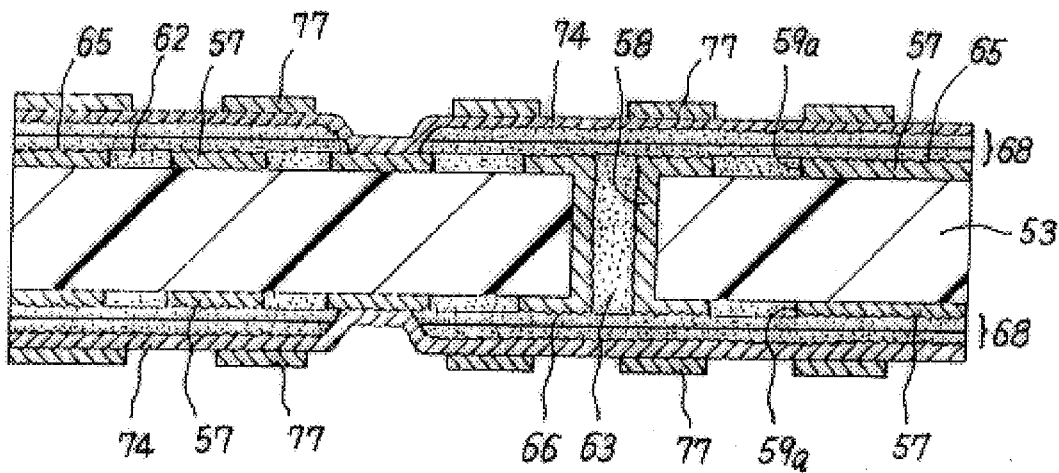
FIG_43

FIG_48
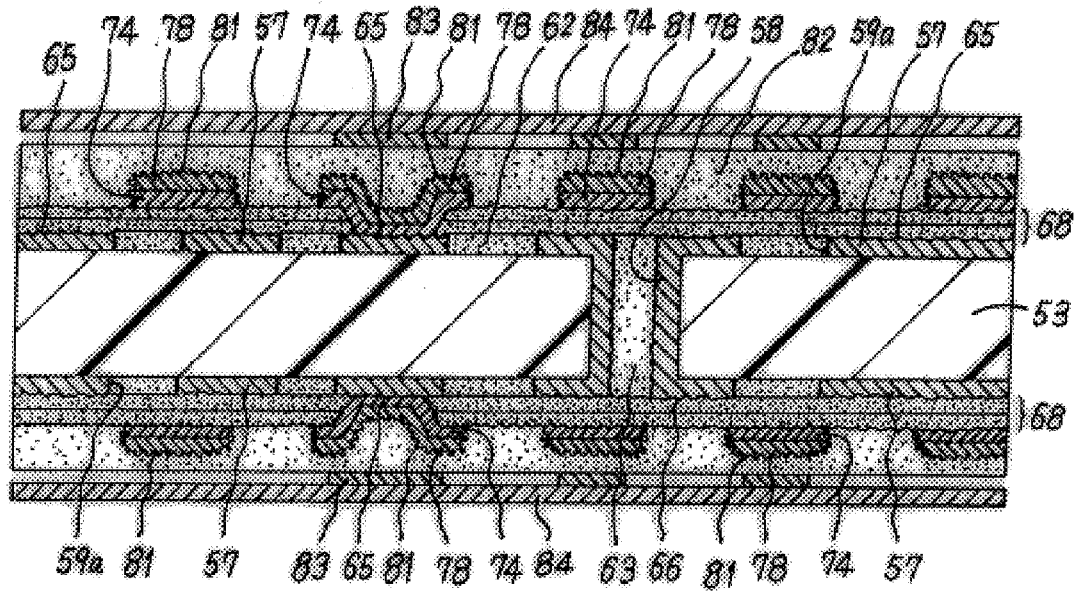
FIG_49
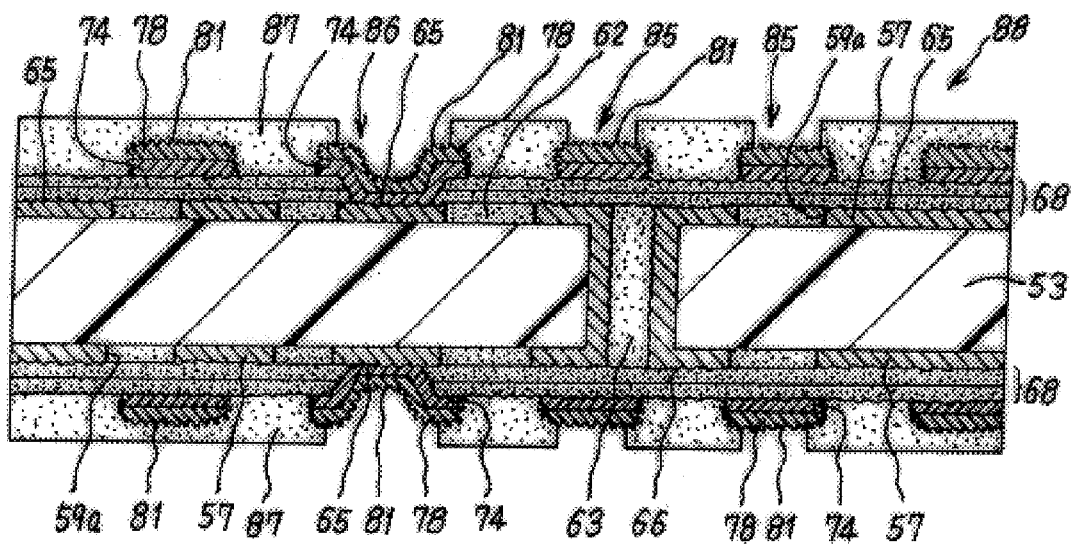

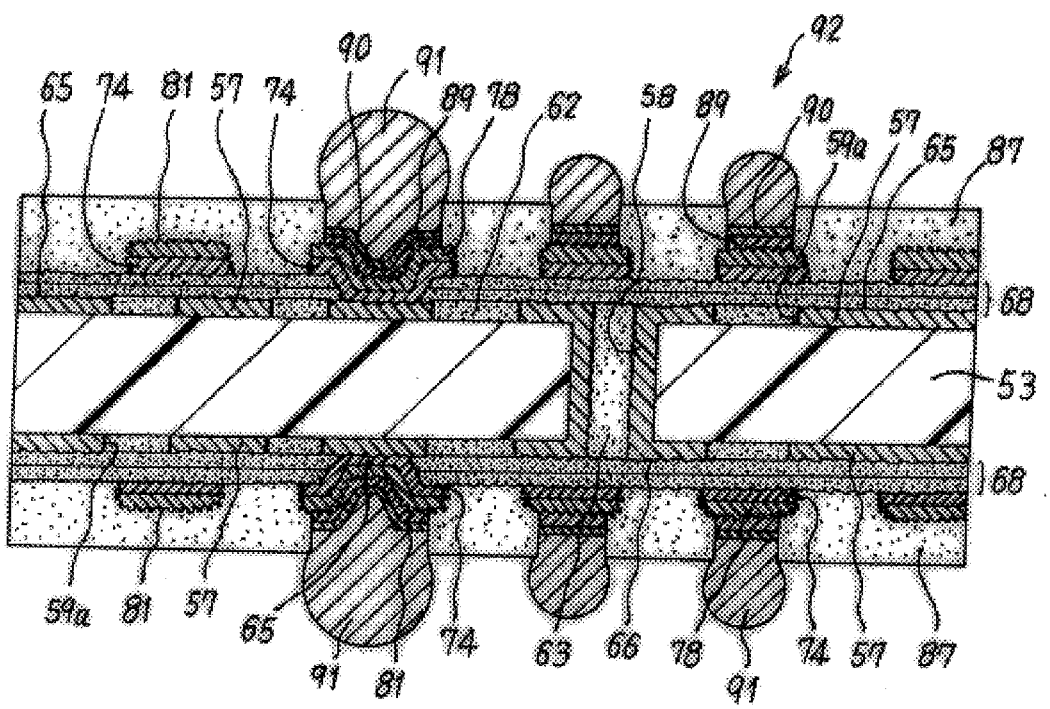
FIG_50

FIG_51
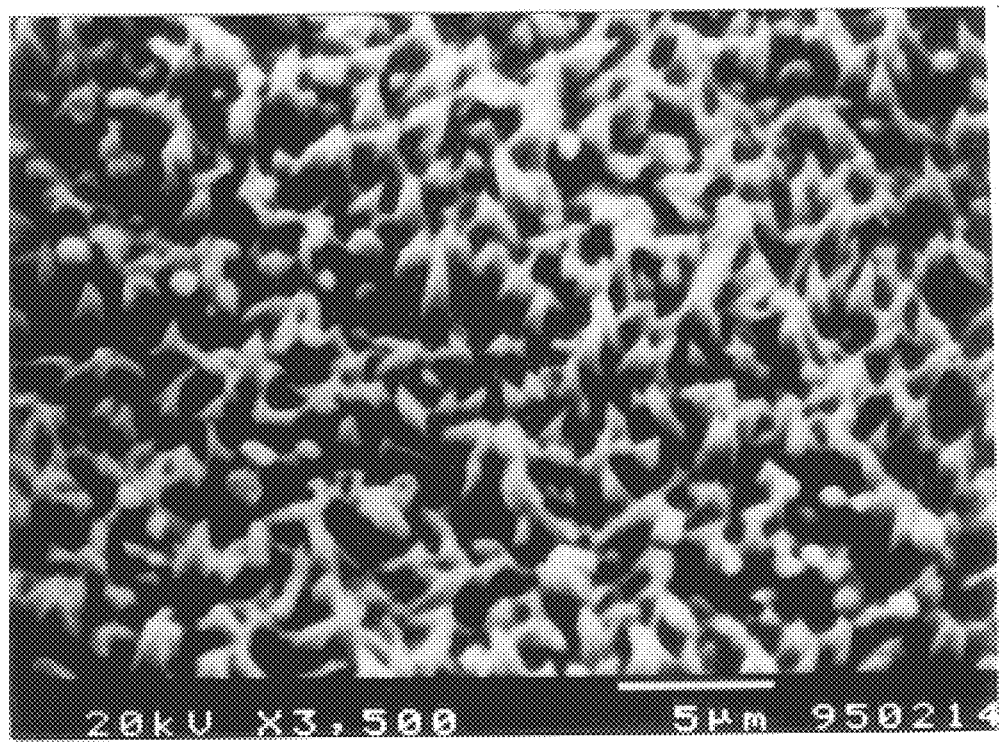

PRINTED WIRING BOARD AND METHOD FOR MANUFACTURING THE SAME

TECHNICAL FIELD

This invention relates to a printed wiring board, and more particularly to a multilayer printed wiring board capable of preventing the peeling of interlaminar resin insulating layer even in the heating or under heat cycle condition and ensuring the connection reliability of a via-hole portion. Furthermore, the invention relates to a printed wiring board having an excellent adhesion property between a conductor circuit for solder pad and a solder resist layer.

BACKGROUND ART

Recently, so-called buildup multilayer wiring board is noticed from a demand for high densification of a multilayer wiring board. The buildup multilayer wiring board is manufactured by a method disclosed, for example, in JP-B-4-55555. That is, an insulating material made of a photosensitive adhesive for electroless plating is applied onto a core substrate having conductor circuits, dried, exposed to a light and developed to form an interlaminar insulating layer having an opening for via-hole. Then, the surface of the interlaminar insulating layer is roughened by a treatment with an oxidizing agent or the like and a plating resist is formed on the resulting roughened surface and thereafter portions not forming the resist are subjected to an electroless plating to form a two-layer conductor circuit pattern including a via-hole. Such steps are repeated plural times to obtain a multilayered buildup wiring board.

And also, a multilayer technique using so-called RCC (RESIN COATED COPPER) is watched as the buildup multilayer printed wiring board. This technique is a technique wherein RCC is laminated on a circuit board and copper foil is etched to from an opening in a position for the formation of a via-hole and a laser beam is irradiated to the opening portion to remove a resin layer and the opening portion is plated to form a via-hole.

Furthermore, there is developed a multilayer technique wherein one-sided circuit boards having a conductive substance filled in a through-hole are laminated through an adhesive layer as described in JP-A-9-36551.

In such a multilayer printed wiring board, a surface of an underlayer conductor circuit is roughened for improving an adhesion property between the surface of the underlayer conductor circuit and the interlaminar resin insulating layer. The thus formed roughened layer can improve the adhesion property in a via-hole portion. Such a roughening is carried out by graphitization-reduction treatment, etching with sulfuric acid-hydrogen peroxide, plating of copper-nickel-phosphorus needle alloy and the like.

The printed wiring board is provided on its surface layer with solder bumps and connected to an IC chip through the solder bumps. In this case, a solder resist layer is formed in the printed wiring board to protect the conductor circuit for solder pad as a surface layer and so as not to fuse solder bumps with each other.

In the printed wiring board, the surface of the conductor circuit is subjected to a roughening treatment for enhancing the adhesion between the conductor circuit for solder pad and the solder resist layer. As the roughening treatment of the conductor circuit, there are used graphitization-reduction treatment, etching with sulfuric acid-hydrogen peroxide, plating of copper-nickel-phosphorus needle alloy and the like.

However, it is known that when the via-hole is formed by plating, the plated film hardly adheres to the roughened layer and it is apt to cause the peeling of via-hole conductor. For this end, it becomes common sense that although the roughened layer is formed on the surface of the underlayer conductor circuit in portions contacting with the interlaminar resin insulating layer, the roughened layer is removed in portions contacting with the via-hole conductor (see, for example, JP-A-3-3298).

PROBLEMS TO BE SOLVED

Even when the surface of the underlayer conductor circuit connecting to the via-hole conductor is flattened, however, there may be caused the peeling of the via-hole conductor from the underlayer conductor circuit in the heating or under heat cycle condition.

In order to solve this problem, it is favorable to improve the adhesion property between the underlayer conductor circuit and the via-hole conductor. However, when the surface of the underlayer conductor circuit is roughened as mentioned above, it is easy to cause the peeling of the via-hole conductor.

Recently, there is noticed a technique using fine wiring as a circuit pattern in the printed wiring board. The high densification of conductor circuits can be attained by such a fine wiring.

In the fine wired conductor circuits, however, the contact area between the conductor circuit and the solder resist layer becomes considerably small and hence the adhesion property between the conductor circuit and the solder resist layer lowers. Particularly, when the conductor circuits are formed on the surface layer of the printed wiring board at a coarse state, the adhesion property between the conductor circuit and the solder resist layer more lowers.

It is an object of the invention to provide a printed wiring board which improves the adhesion property between the conductor circuit and the interlaminar resin insulating layer and the adhesion property between the conductor circuit and the via-hole conductor to ensure the high connection reliability in the via-hole portion.

It is another object of the invention to provide a printed wiring board which enhances the adhesion property between fine wired conductor circuit and the solder resist layer to strongly adhere the conductor circuit to the solder resist layer even in portions forming solder bumps without peeling and cause no poor continuity in the solder bump forming portions.

DISCLOSURE OF THE INVENTION

The invention lies in a multilayer printed wiring board comprising underlayer conductor circuits, an interlaminar resin insulating layer formed on the underlayer conductor circuits, upperlayer conductor circuits formed on the interlaminar resin insulating layer and a via-hole connecting the underlayer conductor circuit to the upperlayer conductor circuit, in which the underlayer conductor circuit has a roughened surface formed by treating with an etching solution containing copper(II) complex and an organic acid, and the under-layer conductor circuit is connected to the via-hole through the roughened surface.

And also, the invention lies in a multilayer printed wiring board comprising underlayer conductor circuits, an interlaminar resin insulating layer formed on the underlayer conductor circuits, upperlayer conductor circuits formed on the interlaminar resin insulating layer and a via-hole connecting the underlayer conductor circuit to the upperlayer conductor circuit, in which the conductor circuit has a roughened surface, and the roughened surface comprises plural anchor portions, recess portions and ridgelines wherein these anchor portions, recess portions and ridgelines are dispersedly formed and the adjoining anchor portions are connected to each other through the ridgelines and the recess portion is surrounded by the anchor portions and the ridgelines, and the underlayer conductor circuit is connected to the via-hole through the roughened surface.

Further, the invention lies in a multilayer printed wiring board comprising underlayer conductor circuits and an interlaminar resin insulating layer formed on the underlayer conductor circuits, in which the underlayer conductor circuit has a roughened surface formed by treating with an etching solution containing copper(II) complex and an organic acid, and the roughened surface is covered with a metal layer made of at least one metal selected from the group consisting of titanium, aluminum, zinc, iron, indium, thallium, cobalt, nickel, tin, lead, bismuth and noble metal, and the interlaminar resin insulating layer is formed on the roughened surface and a method of producing such a multilayer printed wiring board.

And also, the invention lies in a multilayer printed wiring board comprising underlayer conductor circuits and an interlaminar resin insulating layer formed on the underlayer conductor circuits, in which the underlayer conductor circuit has a roughened surface, and the roughened surface comprises plural anchor portions, recess portions and ridgelines wherein these anchor portions, recess portions and ridgelines are dispersedly formed and the adjoining anchor portions are connected to each other through the ridgelines and the recess portion is surrounded by the anchor portions and the ridgelines, and the roughened surface is covered with a metal layer made of at least one metal selected from the group consisting of titanium, aluminum, zinc, iron, indium, thallium, cobalt, nickel, tin, lead, bismuth and noble metal, and the interlaminar resin insulating layer is formed on the roughened surface and a method of producing such a multilayer printed wiring board.

Moreover, the invention lies in a printed wiring board comprising conductor circuits for solder pads, a solder resist layer formed on the conductor circuits for solder pads and an opening portion formed in the solder resist layer for the arrangement of a solder body, in which the conductor circuit for solder pad has a roughened surface formed by treating with an etching solution containing copper(II) complex and an organic acid, and the solder resist layer is formed on the roughened surface.

And also, the invention lies in a printed wiring board comprising conductor circuits for solder pads, a solder resist layer formed on the conductor circuits for solder pads and an opening portion formed in the solder resist layer for the arrangement of a solder body, in which the conductor circuit has a roughened surface, and the roughened surface comprises plural anchor portions, recess portions and ridgelines wherein these anchor portions, recess portions and ridgelines are dispersedly formed and the adjoining anchor portions are connected to each other through the ridgelines and the recess portion is surrounded by the anchor portions and the ridgelines, and the solder resist layer is formed on the roughened surface.

The inventors have reexamined the roughening treatment on the surface of the underlayer conductor circuit for improving the adhesion property between the underlayer conductor circuit and the via-hole conductor. As a result, the peeling between the underlayer conductor circuit and the interlaminar resin insulating layer is observed in the heating or under heat cycle condition in case of graphitization-reduction treatment and etching with sulfuric acid-hydrogen peroxide among various roughening treatments.

According to the inventors' knowledge, the adhesion property between the conductor circuit and the interlaminar resin insulating layer is most excellent in the needle alloy plating among the roughening treatments. In the needle alloy plating, however, there is observed a phenomenon that the peeling is caused between the underlayer conductor circuit and the via-hole conductor in the heating or under heat cycle to increase a value of resistance to continuity.

When the roughened layer is formed by subjecting the surface of the underlayer conductor circuit to copper-nickel-phosphorus needle alloy plating, the interlaminar resin insulating layer is formed on the roughened layer and holes for the formation of via-hole are formed by irradiating a laser beam and then subjecting to a desmear treatment or light exposure and development treatment.

The inventors have made various studies with respect to these treatments and confirmed that the resin based on the interlaminar insulating layer remains in space formed by overlapping the needle alloys with each other and expands in the heating or heat cycle to cause the peeling between the underlayer conductor circuit and the via-hole conductor. And also, it has been found that such a resin residue results in the crowding of the needle alloys and is caused due to the fact that solution such as an oxidizing agent or the like does not flow between the needle alloys when the developing solution or the resin residue is removed.

Under the above knowledge, the inventors have examined the roughening treatment of the conductor circuit surface in detail. As a result, it is surprisingly found that the adhesion property between the conductor circuit and the via-hole conductor is considerably improved by treating the surface of the conductor circuit with an etching solution containing copper(II) complex and an organic acid, and the invention has been accomplished.

In the invention, the roughened surface having a given roughening shape considerably enhances the adhesion property between the conductor circuit and the via-hole conductor. In such a roughened surface, there is no space formed by overlapping needle projections with each other as in the plating. For this end, the resin hardly remains on the surface of the under-layer conductor circuit and hence the peeling of the via-hole conductor from the underlayer conductor circuit is not caused in the heating or heat cycle.

And also, the roughened surface according to the invention is excellent in the affinity with the plating solution, so that the plating solution penetrates into the recess portions of the roughened surface to adhere around the anchor portions of the roughened surface and hence the anchor portions bite into the via-hole to more adhere the conductor circuit to the via-hole conductor. Further, in the roughened surface according to the invention, the anchor portions bite into the interlaminar resin insulating layer, so that there is not caused the peeling between the conductor circuit and the interlaminar resin insulating layer.

Thus, the printed wiring board according to the invention has the above roughened surface, so that the peeling between the underlayer conductor circuit and the interlaminar resin insulating layer or the peeling between the underlayer conductor circuit and the via-hole conductor can be prevented in the heating or under heat cycle condition.

The inventors have made further studies in order to obtain a multilayer printed wiring board causing no peeling between the underlayer conductor circuit and the interlaminar resin insulating layer or between the underlayer conductor circuit and the via-hole conductor even in the heating or under heat cycle condition and providing a higher connection reliability in the via-hole portion.

As a result, the inventors have confirmed that after the conductor circuit is treated with an etching solution containing copper(II) complex and an organic acid to form a roughened surface, the roughened surface is covered with a hardly oxidizing metal layer to prevent he surface oxidation or covered with a metal layer damaging the adhesion property to the resin or the adhesion property to the via-hole conductor even if it is oxidized to considerably improve the adhesion property between the conductor circuit and the resin insulating layer or the adhesion property between the conductor circuit and the via-hole conductor and as a result, the invention has been accomplished.

In the invention, the roughened surface having a given roughening shape as formed with a given etching solution is formed on the surface of the conductor circuit and covered with a metal layer made of at least one metal selected from the group consisting of titanium, aluminum, zinc, iron, indium, thallium, cobalt, nickel, tin, lead, bismuth and noble metal.

Such a metal layer prevents the oxidation of the surface of the conductor circuit made of copper or the like and does not form an oxide film on the conductor circuit or does not lower the adhesion property between the metal layer and the resin or between the metal layer and the via-hole conductor even if the metal itself is oxidized.

In the multilayer printed wiring board according to the invention, the metal layer can prevent the lowering of the adhesion strength between the roughened surface and the interlaminar resin insulating layer resulted from the peeling of the oxide film and the lowering of the adhesion strength between the roughened surface and the via-hole conductor.

Further, the inventors have made various examinations with respect to the roughening method of the conductor circuit surface in order to improve the adhesion property between the surface layer of the multilayer printed wiring board and the solder resist layer. Particularly, the inventors have examined the methods such as graphitization-reduction treatment, etching with sulfuric acid-hydrogen peroxide, copper-nickel-phosphorus needle alloy plating and the like with respect to the demand of increasing the adhesion between the conductor circuit formed by fine wiring and the solder resist layer.

As a result, it has been confirmed that the graphitization-reduction treatment is unsuitable as a roughening treatment in the fine wiring. In the graphitization-reduction treatment and the etching with sulfuric acid-hydrogen peroxide, it has been found that when the wiring density is made coarse in the fine wiring of not more than 50 $\mu$m, the contact area between the conductor circuit and the solder resist layer is decreased through convex portions formed in the roughened surface and the adhesion force of the solder resist layer can not be increased. Particularly, it has been found that the peeling is caused in the coarse portion of the wiring density under heat cycle condition.

And also, it has been found that the formation of the roughened layer through the copper-nickel-phosphorus needle alloy plating is excellent in the adhesion property between the conductor circuit and the solder resist and the sufficient adhesion force is indicated even in the fine wiring, particularly in the coarse portion of wiring of not more than 50 $\mu$m. However, this roughened layer is formed by the plating, so that as the fine wiring density becomes higher, the precipitated needle alloys grow on the roughened layer to connect the conductor circuits to each other and finally the poor continuity is caused.

In the formation of the roughened layer made of the needle alloy, the severe control and maintenance of the plating solution is necessary for preventing the abnormal precipitation due to the growth of the needle alloy. And also, the solder resist layer made of the resin is removed through light exposure and development in the bump forming portions. In this case, the needle projections crowd with each other in the roughened layer made of the needle alloy, so that the distance between the projections is narrow and hence the oxidizing agent solution for removing the developing solution or the resin residue does not flow in the formation of the opening portion and the resin remains between the projections to leave the organic residue of the solder resist forming resin in the bottom of the opening portion. Such a residue may cause the poor continuity between the conductor circuit in the opening portion and the metal beneath the bump.

Under the above knowledge, the inventors have made various studies with respect to the other roughening treatment. As a result, it has been found out that the roughened surface formed by treating the surface of the conductor circuit with an etching solution containing copper(II) complex and an organic acid is excellent in the adhesion property to the solder resist forming resin and the adhesion property to the metal beneath the bump and is very suitable for the formation of the solder bump, and the invention has been accomplished.

In the printed wiring board according to the invention, the roughened surface having a given roughening shape as formed with the above etching solution is formed on the conductor circuit and the solder resist layer is formed through the roughened surface. The roughened surface can be formed on the conductor circuits having a high wiring density with fine wiring of not more than 50 $\mu$m without causing the poor continuity as in the copper-nickel-phosphorus needle alloy plating.

And also, the above roughened surface is excellent in the adhesion property to the solder resist layer and can ensure the sufficient adhesion property between the conductor circuit and the solder resist layer when the solder resist layer is removed in the solder bump forming portions to decrease the contact area between the conductor circuit and the solder resist layer or even in the printed wiring board wherein the wiring density with fine wiring is at a coarse state.

Further, the roughened surface is less in the resin residue on the roughened surface when the solder resist layer is removed to form an opening portion for the formation of solder bump and is excellent in the adhesion property to the metal beneath the bump and does not cause the poor continuity in the solder bump forming portion.

BRIEF DESCRIPTION OF THE DRAWINGS

FIG. 1 is a microphotograph showing an embodiment of the roughened surface according to the invention.

FIG. 2 is a microphotograph showing another embodiment of the roughened surface according to the invention.

FIG. 3 is a microphotograph showing the other embodiment of the roughened surface according to the invention.

FIG. 20 is a step of producing another embodiment of the multilayer printed wiring board according to the invention.

FIG. 21 is a step of producing another embodiment of the multilayer printed wiring board according to the invention.

FIG. 22 is a step of producing another embodiment of the multilayer printed wiring board according to the invention.

FIG. 23 is a step of producing another embodiment of the multilayer printed wiring board according to the invention.

FIG. 24 is a step of producing another embodiment of the multilayer printed wiring board according to the invention.

FIG. 25 is a step of producing another embodiment of the multilayer printed wiring board according to the invention.

FIG. 26 is a step of producing another embodiment of the multilayer printed wiring board according to the invention.

FIG. 27 is a step of producing another embodiment of the multilayer printed wiring board according to the invention.

FIG. 28 is a step of producing another embodiment of the multilayer printed wiring board according to the invention.

FIG. 36 is a step of producing the other embodiment of the multilayer printed wiring board according to the invention.

FIG. 37 is a step of producing the other embodiment of the multilayer printed wiring board according to the invention.

FIG. 38 is a step of producing the other embodiment of the multilayer printed wiring board according to the invention.

FIG. 39 is a step of producing the other embodiment of the multilayer printed wiring board according to the invention.

FIG. 40 is a step of producing the other embodiment of the multilayer printed wiring board according to the invention.

FIG. 41 is a step of producing the other embodiment of the multilayer printed wiring board according to the invention.

FIG. 42 is a step of producing the other embodiment of the multilayer printed wiring board according to the invention.

FIG. 43 is a step of producing the other embodiment of the multilayer printed wiring board according to the invention.

FIG. 48 is a step of producing the other embodiment of the multilayer printed wiring board according to the invention.

FIG. 49 is a step of producing the other embodiment of the multilayer printed wiring board according to the invention.

FIG. 50 is a step of producing the other embodiment of the multilayer printed wiring board according to the invention.

FIG. 51 is a microphotograph showing an roughened surface made of needle alloy.

BEST MODE FOR CARRYING OUT THE INVENTION

The invention will be described in detail with reference to the accompanying drawings.

When the underlayer conductor circuit or conductor circuit for solder pad is treated with the etching solution according to the invention, the surface has a roughened surface having anchor portions as shown in FIGS. 1~12, which is different from a needle alloy plating. FIG. 1 is a microphotograph showing an embodiment of the roughened surface according to the invention. This photograph is obtained by obliquely picturing the roughened surface by means of an electron microscope. FIG. 2 is a microphotograph showing another embodiment of the roughened surface according to the invention. This is pictured in the same manner as in FIG. 1 except that the magnification is increased. FIG. 3 is a microphotograph showing the other embodiment of the roughened surface according to the invention. This photograph is obtained by picturing the roughened surface just above by means of an electron microscope at the same magnification as in FIG. 2.

In the multilayer printed wiring board according to the invention, the underlayer conductor circuits and the interlaminar resin insulating layer or the underlayer conductor circuits and the via-hole conductors are connected to each other through the roughened surface as shown in the electron microphotographs.

And also, in the multilayer printed wiring board according to the invention, the roughened surface as shown in the electron microphotographs is covered with a metal layer, and the conductor circuits and the interlaminar resin insulating layer or the underlayer conductor circuits and the via-hole conductors are connected to each other through the metal layer.

Furthermore, in the printed wiring board according to the invention, the solder resist layer is formed on the conductor circuit for solder pad through the roughened surface of such a conductor circuit as shown in the electron microphotographs.

Figure 4:
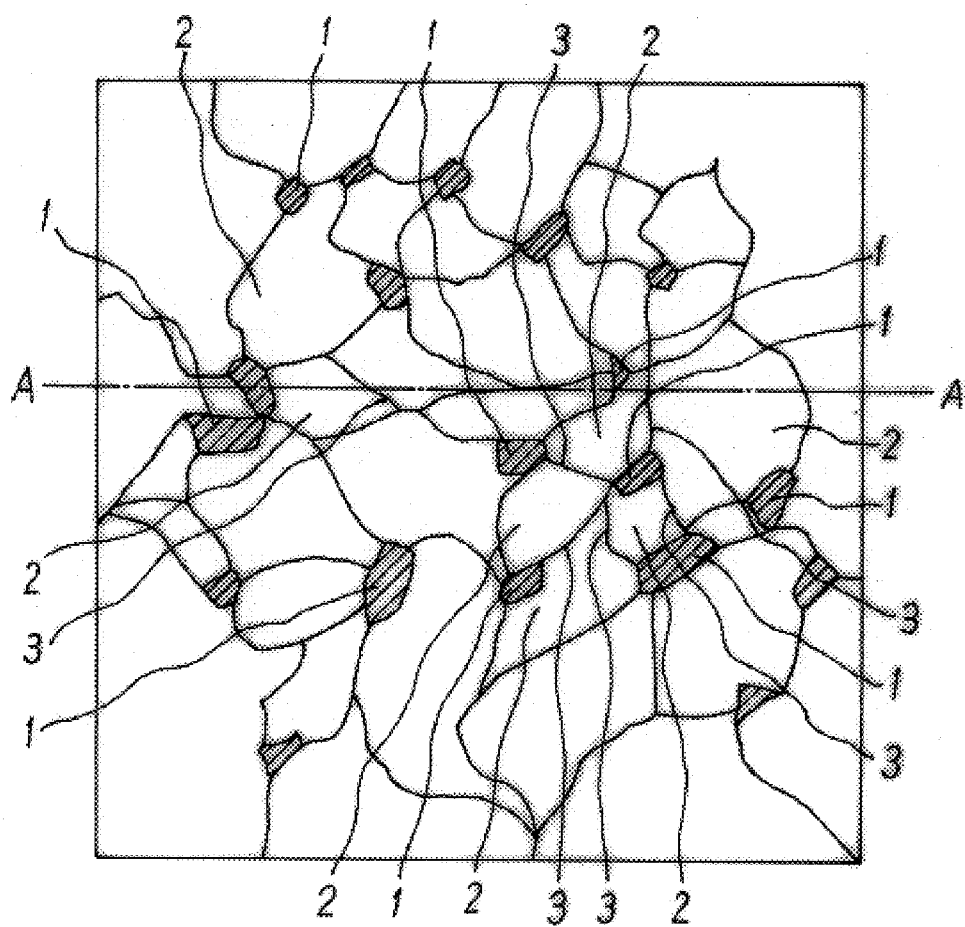
FIG. 4 is a diagrammatic view illustrating an embodiment of the roughened surface according to the invention.
Figure 5:
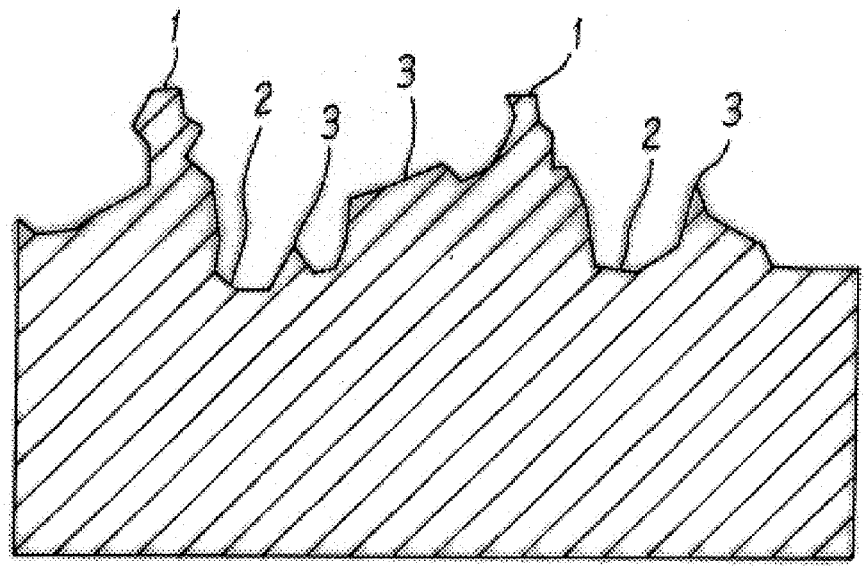
FIG. 5 is a diagrammatic view illustrating an embodiment of the roughened surface according to the invention.
Figure 6:
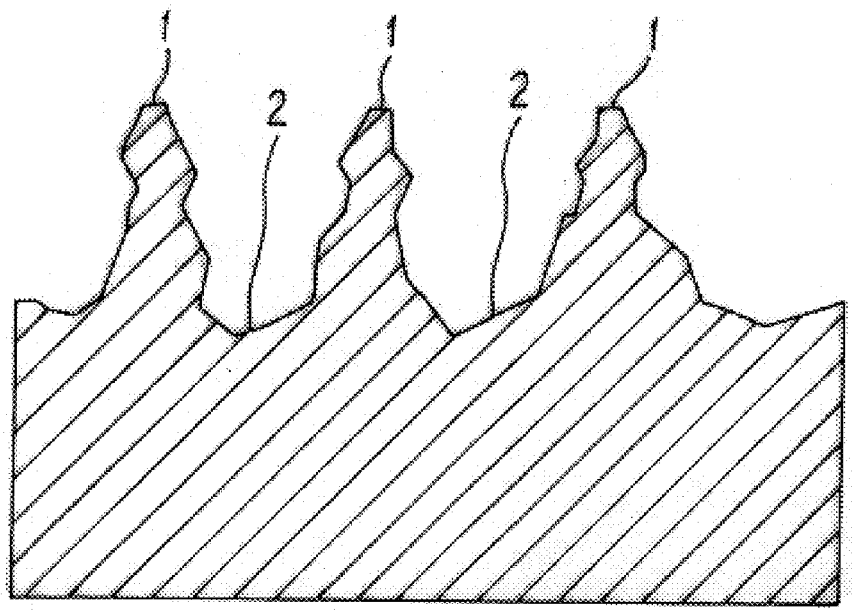
FIG. 6 is a diagrammatic view illustrating an embodiment of the roughened surface according to the invention.
Figure 7:
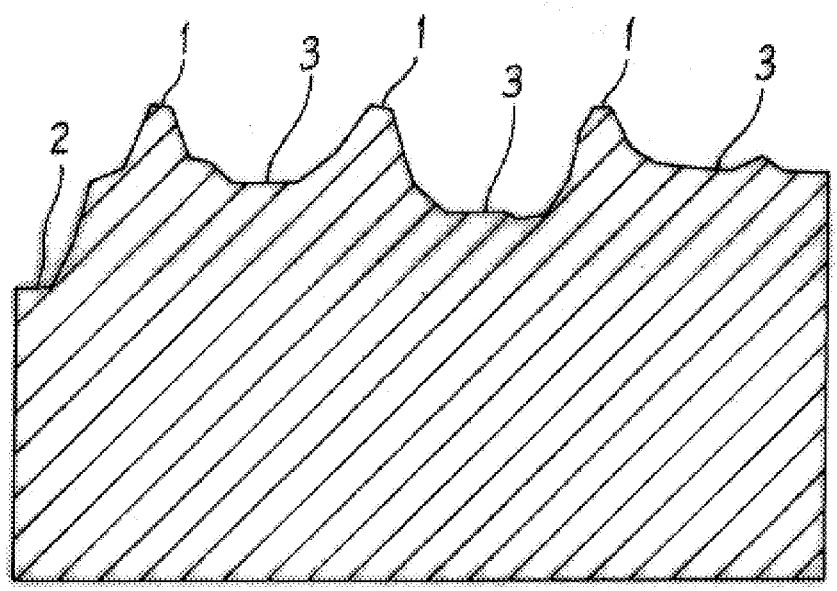
FIG. 7 is a diagrammatic view illustrating an embodiment of the roughened surface according to the invention.
Figure 8:
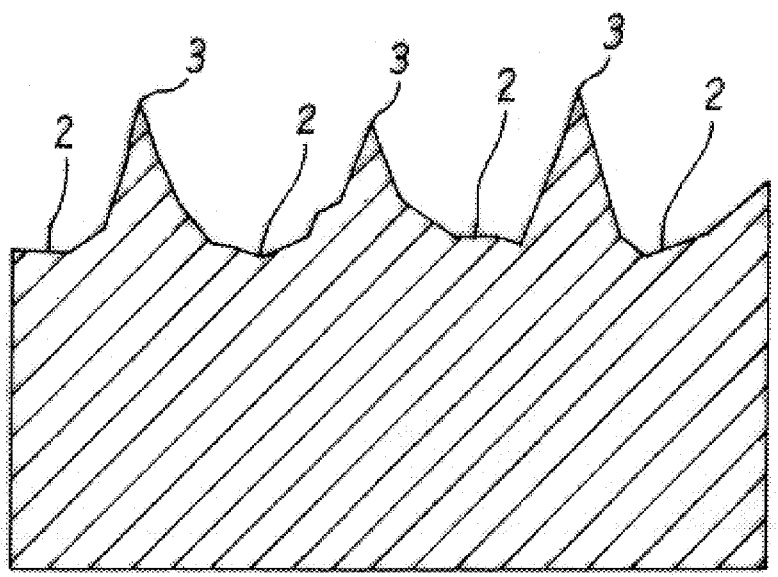
FIG. 8 is a diagrammatic view illustrating an embodiment of the roughened surface according to the invention.
Figure 9:
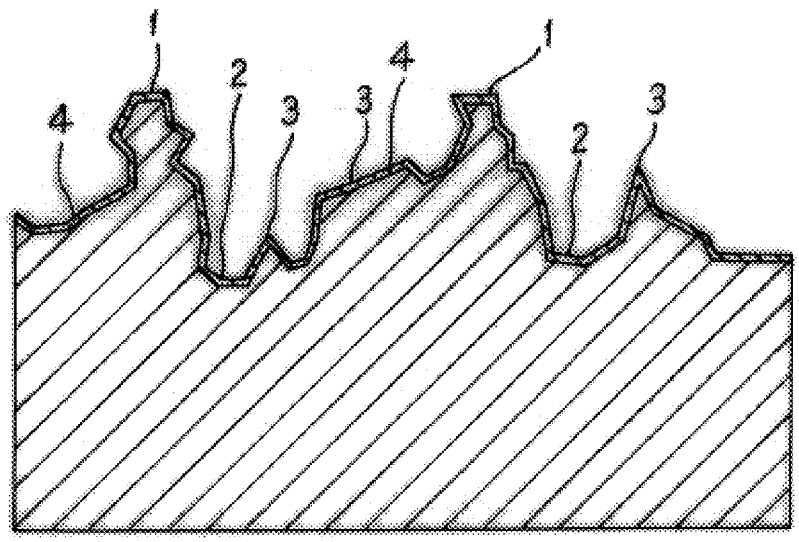
FIG. 9 is a diagrammatic view illustrating another embodiment of the roughened surface according to the invention.
Figure 10:
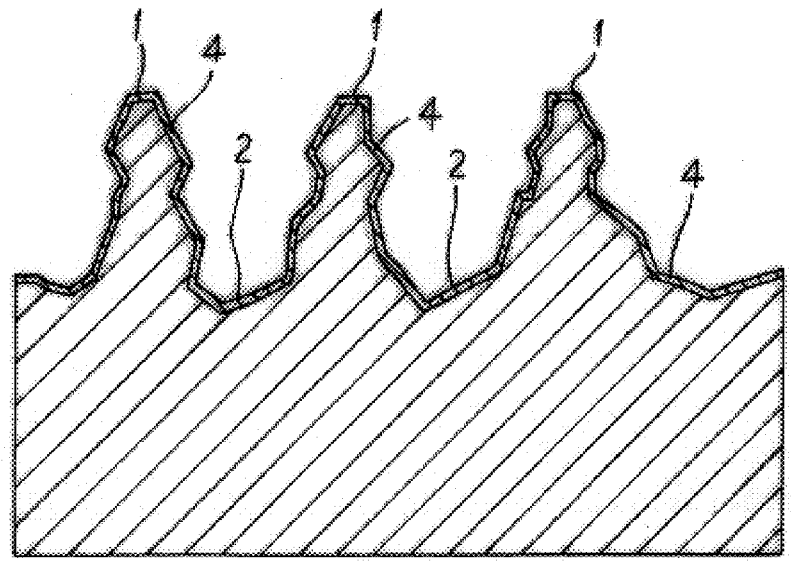
FIG. 10 is a diagrammatic view illustrating another embodiment of the roughened surface according to the invention.
Figure 11:
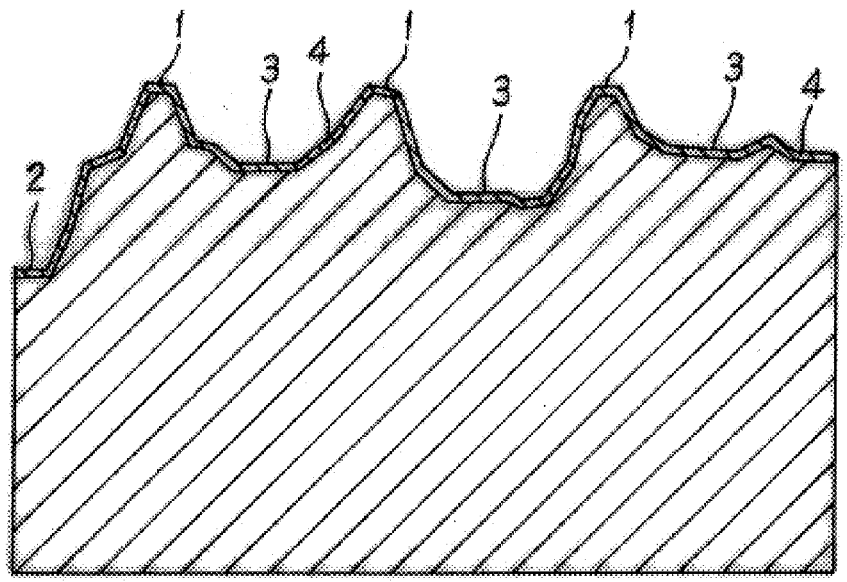
FIG. 11 is a diagrammatic view illustrating another embodiment of the roughened surface according to the invention.
Figure 12:
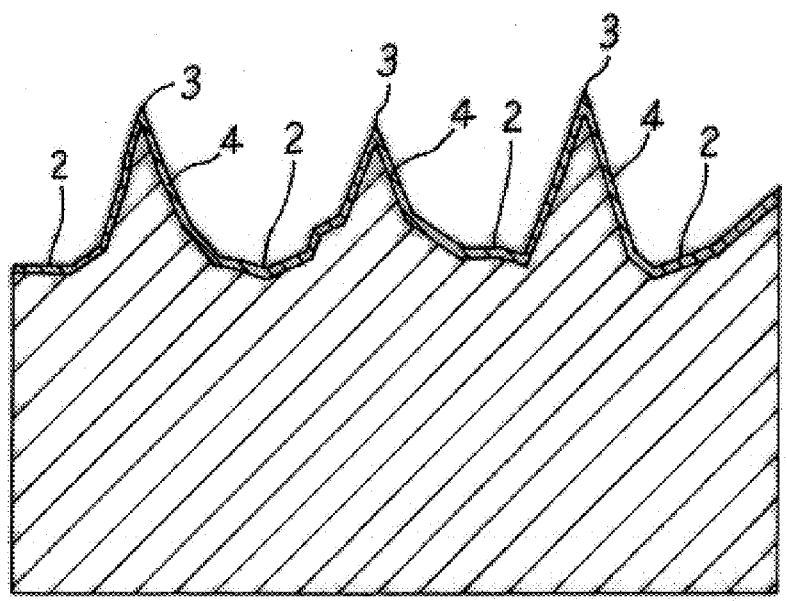
FIG. 12 is a diagrammatic view illustrating another embodiment of the roughened surface according to the invention.

FIGS. 4–8 are diagrammatic views of such a roughened surface. FIG. 4 is a plan view, and FIG. 5 is a longitudinal section view taken along a line A—A of FIG. 4, and FIG. 6 is a longitudinal section view cut between an anchor portion and a recess portion, and FIG. 7 is a longitudinal section view illustrating a ridgeline between the anchor portions, and FIG. 8 is a longitudinal section view cut between the ridgeline and the recess portion.

As shown in FIGS. 4 and 5, the roughened surface according to the invention comprises plural anchor portions 1, plural recess portions 2 and plural ridgelines 3 wherein these anchor portions 1, recess portions 2 and ridgelines 3 are dispersed. As shown in FIG. 6, the recess portion 2 is formed between the anchor portion 1 and another adjacent anchor portion 1.

As shown in FIG. 7, the anchor portion 1 and another adjacent anchor portion 1 are connected through the ridgeline 3. As shown in FIGS. 6 and 8, the recess portion 2 is surrounded by the anchor portions 1 and the ridgelines 3.

For the comparison, the microphotograph of the conventional roughened surface made of the needle alloy by plating is shown in FIG. 51. In the roughened surface shown in this electron microphotograph, the needle alloys are overlapped with each other to form spaces between the needle alloys. In such a needle alloy structure of Cu—Ni—P, needle-shaped projections crowd with each other, so that the distance between the projections is narrow, and hence an oxidizing agent solution for removing a developing solution or resin residue does not flow and the resin remains between the projections to form the resin residue.

On the contrary, the roughened surface according to the invention indicates such a complicated uneven shape that the anchor portions are existent in highest portions of the roughened surface, and the recess portions are formed in lowest portions around the anchor portions and the anchor portion and another adjacent anchor portion are connected through the ridgeline lower than the anchor portion but higher than the recess portion. The roughened surface having such a complicated uneven shape is excellent in the affinity with the plating solution, so that the plating solution penetrates into the recess portions of the roughened surface to adhere to the anchor portions of the roughened surface and hence the anchor portions bite in the via-hole conductor so as not to lower the adhesion property between the conductor circuit and the via-hole conductor. And also, the anchor portions of the roughened surface bite in the resin insulating layer to more adhere the conductor circuit to the resin insulating layer.

When the roughened surface having the complicated uneven shape is formed on the conductor circuit for solder pad, the anchor portions bite in the solder resist layer to strongly adhere the conductor circuit to the solder resist layer, so that there is caused no peeling between the conductor circuit and the solder resist layer in the solder bump forming portions even when the wiring density in the fine wiring is particularly at a coarse state. Further, such a roughened surface is excellent in the affinity with the plating solution, so that the plating solution penetrates into the recess portions of the roughened surface to adhere to the anchor portions of the roughened surface and hence the anchor portions bite in the metal beneath the solder bump so as not to lower the adhesion property between the conductor circuit and the solder bump.

In such a roughened surface, the anchor portions do not crowd with each other. And also, the ridgeline connecting the anchor portions to each other has a shape not obstructing the flow of the resin. For this end, the oxidizing agent solution for removing the developing solution or the resin residue easily flows between the recess portions or between the anchor portions in the roughened surface and the resin is hardly stored. Therefore, the roughened surface according to the invention does not cause the resin residue after the development treatment and is excellent in the adhesion property to the via-hole conductor and the adhesion property to the metal beneath solder bump.

Thus, the roughened surface according to the invention has an optimum shape for preventing the resin residue after the development treatment while maintaining the adhesion property between the conductor circuit and the resin insulating layer, adhesion property between the underlayer conductor circuit and the via-hole conductor, adhesion property between the conductor circuit and the solder resist layer and adhesion property between the conductor circuit and the metal beneath solder bump.

The roughened surface according to the invention can be formed, for example, by removing metal crystal particles on the surface of the conductor circuit with an etching solution containing copper(II) complex and an organic acid. In such a roughened surface, portions largely etching the metal crystal particles are formed as a recess portion (concave portion). The recess portions can be formed in the shape corresponding to approximately polyhedral shape inherent to the metal crystal particle. In the invention, the term "approximately polyhedral shape" used herein means a polyhedron such as trihedron, tetrahedron, pentahedron, hexahedron or the like and a combination of two or more of these polyhedrons. Such a recess portion can prevent the resin residue after the developing treatment.

And also, the anchor portions of the roughened surface can be formed as portions left by dropping off the metal crystal particles. The thus formed anchor portions are squarish convex portions and surrounded by the recess portions, so that they do not overlap with each other. The roughened surface having such a complicated uneven shape can prevent the resin residue after the development treatment while maintaining the adhesion properties to the resin, via-hole conductor, solder resist layer and the metal beneath solder bump.

Furthermore, the ridgelines of the roughened surface are formed by dropping off adjoining metal crystal particles. These ridgelines connect the anchor portion and another adjacent anchor portion to each other at a position lower than the height of the anchor portion. These ridgelines can be formed at a branched state by dropping off three or more adjoining metal crystal particles. And also, the ridgelines can be formed at a sharp-edged state because the metal crystal particles are dropped off in approximately polyhedral shape. These ridgelines disperse the anchor portions so as to surround the anchor portion by the recess portions and the ridgelines. In the roughened surface having such a more complicated uneven shape, the contact area to the resin, via-hole conductor, solder resist layer or the metal beneath solder bump is widened to more improve the adhesion property and the resin residue can be more prevented.

The roughened surface is preferable to have a maximum roughness (Rmax) of 0.1~10 μm. When it is less than 0.1 μm, the adhesion property to the resin insulating layer, adhesion property to the via-hole conductor, adhesion property to the solder resist layer and adhesion property to the metal beneath solder bump are considerably lowered, while when it exceeds 10 μm, the resin residue is created after the development treatment and it is apt to cause problems such as wiring breakage and the like.

And also, the roughened surface is favorable to have 2~100 anchor portions and 2~100 recess portions per 25 μm² on average. When the number of anchor portions per 25 μm² is 2~100 on average, the resin residue after the developing treatment can be prevented while maintaining the adhesion property between the roughened surface and the via-hole conductor, the adhesion property between the roughened surface and the solder resist layer and the adhesion property between the roughened surface and the metal beneath solder bump, while when the number of recess portions per 25 μm² is 2~100 on average, the crowd of the anchor portions is prevented to control the occurrence of resin residue after the development treatment and also the adhesion property between the roughened surface and the resin insulating layer, the adhesion property between the roughened surface and the via-hole conductor, the adhesion property between the roughened surface and the solder resist layer and the adhesion property between the roughened surface and the metal beneath solder bump can be maintained.

In the invention, the number of ridgelines per 25 μm² is desirable to be 3~3000 on average. When the number of ridgelines is within the above range, the shape of the roughened surface becomes complicated and the contact area to the resin insulating layer or the via-hole conductor is widened, whereby the adhesion property to the resin insulating layer and the like, or the adhesion property to the solder resist layer and the like can be improved and at the same time the resin residue can easily be removed.

Moreover, the number of each of anchor portions, recess portions and ridgelines is represented by an average of measured values when the roughened surface is pictured just above and obliquely from above by 45° by means of an electron microscope at 5000 magnification as shown in FIGS. 2 and 3 and each number is measured at an optional region of 25 μm².

FIGS. 9~12 are section views of another embodiment of the roughened surface according to the invention. In FIGS. 9~12, the roughened surface as shown in FIGS. 4~8 is covered with a metal layer 4.

The metal layer 4 as shown in FIGS. 9~12 is made of a hardly oxidized or corroded metal or a metal not damaging the adhesion property to the resin or the adhesion property to the via-hole conductor even if this metal itself is oxidized. And also, the metal layer prevents the formation of oxide film or corrosion film on the roughened surface, and does not damage the adhesion property to the resin or the via-hole conductor even if the metal itself is oxidized. The metal layer can prevent the lowering of the adhesion property between the roughened surface and the resin insulating layer and the adhesion property between the roughened surface and the via-hole conductor due to the peeling of the oxide film.

Since the metal layer can increase the hardness of the metal constituting the roughened surface, metal breakage is not caused at the roughened surface, so that the peeling between the roughened surface and the resin insulating layer or between the roughened surface and the via-hole conductor is more prevented.

In the multilayer printed wiring board according to the invention, the roughened surface has the metal layer, so that the oxide layer is hardly formed on the roughened surface. If the oxide layer is formed, the adhesion property to the resin or via-hole conductor is maintained and hence the peeling between the roughened surface and the resin insulating layer or between the roughened surface and the via-hole conductor is not caused even by heating.

The metal layer is made of at least one metal selected from the group consisting of titanium, aluminum, zinc, iron, indium, thallium, cobalt, nickel, tin, lead, bismuth and a noble metal. These metals hardly cause oxidation, and if they are oxidized, the adhesion property between the metal layer and the resin is not lowered. And also, these metals are excellent in the adhesion property to the resin. Further, they are a metal or a noble metal having an ionization tendency larger than copper but not smaller than titanium. When the roughened surface is covered with a layer of such a metal or noble metal, there can be prevented the dissolution of the conductor circuit through local electrode reaction in the roughening of the resin insulating layer.

As the hardly oxidizing metal, mention may be made of non-oxidizing metals such as nickel, tin, cobalt and noble metal. As the noble metal, at least one of gold, silver, platinum and palladium is desirable. As the metal not lowering the adhesion property between the metal layer and the resin even if such a metal is oxidized, mention may be made of titanium, aluminum, zinc, iron, indium, thallium, lead and bismuth.

When titanium, aluminum, zinc, iron, indium, thallium, cobalt, nickel, tin, lead, bismuth or noble metal is selected among these metals, if the via-hole is formed in the multilayer printed wiring board, the oxide film is not formed around the via-hole. Therefore, when using the metal layer made of such a metal, the haloing (pink ring) can also be prevented.

The thickness of the metal layer is within a range of 0.01~5 μm. The metal layer having the thickness within the above range can prevent the oxidation of copper conductor circuit while maintaining the uneven shape of the roughened surface.

The formation of the roughened surface according to the invention will be described below. The roughened surface can be formed by treating the underlayer conductor circuits or conductor circuits for solder pads with an etching solution containing copper(II) complex and an organic acid. Such an etching solution can dissolve the copper conductor of the conductor circuit under an oxygen existing condition such as spraying, bubbling or the like. In this case, the etching is guessed to proceed according to the following reaction formula:

$$Cu+Cu(II)A_n \to 2Cu(I)A_{n/2} \to \text{aeration} \to 2Cu(I)A_{n/2}+n/4O_2+nAH \to 2Cu(II)A_n+n/2H_2O$$

wherein A is a complexing agent (acting as a chelate agent) and n is coordination number).

As shown in the above reaction formula, the resulting copper(I) complex is dissolved by an acid and bonds with oxygen to form copper(II) complex, which again contributes to the oxidation of copper.

The copper(II) complex used in the invention is favorably a copper(II) complex of an azole. This type of the copper(II) complex acts as an oxidizing agent oxidizing metallic copper or the like. As the azole, there are mentioned diazoles, triazoles and tetrazoles. Among them, imidazole, 2-methylimidazole, 2-ethylimidazole, 2-ethyl-4-methylimidazole, 2-phenylimidazole, 2-undecylimidazole and the like are preferable. The addition amount of the copper(II) complex of the azole is preferably 1~15% by weight. Because, the complex is excellent in the solubility and stability within the above range.

The organic acid is compounded with the copper(II) complex for dissolving copper oxide. As the organic acid, there is favorably at least one selected from the group consisting of formic acid, acetic acid, propionic acid, butyric acid, valeric acid, caproic acid, acrylic acid, crotonic acid, oxalic acid, malonic acid, succeinic acid, gultaric acid, maleic acid, benzoic acid, glycolic acid, lactic acid, malic acid and sulfamic acid. The addition amount of the organic acid is preferably within a range of 0.1~30% by weight formaintaining the solubility of the oxidized copper and ensuring the solution stability.

To the etching solution according to the invention may be added a halogen ion such as fluorine ion, chlorine ion, bromine ion or the like for assisting the dissolution of copper and the oxidation action of the azole. Such a halogen ion may be supplied as hydrochloric acid, sodium chloride or the like. The addition amount of the halogen ion is favorably within a range of 0.01~20% by weight because the adhesion property between the resulting roughened surface and the interlaminar resin insulating layer is excellent.

The etching solution according to the invention can be prepared by dissolving the copper(II) complex of the azole and the organic acid (if necessary, halogen ion) in water. Alternatively, there may be used a commercially available etching solution, for example "Mech Etchbond", trade name, made by Mech Corporation.

An etching quantity with the etching solution is favorably within a range of 0.1~10 $\mu$m when the conductor circuit to be treated is the underlayer conductor circuit. In case of the etching treatment over the above quantity, there is caused the poor continuity between the resulting roughened surface and the via-hole conductor.

When the conductor circuit to be treated is the conductor circuit for solder pad, the etching quantity with the etching solution is favorably within a range of 0.1~10 $\mu$m. When it is less than 0.1 $\mu$m, the adhesion property between the roughened surface and the solder resist layer lowers, while when it exceeds 10 $\mu$m, the resin residue is apt to be caused and also the wiring breakage and the like are easily caused in the fine wiring of not more than 50 $\mu$m.

In the invention, the interlaminar resin insulating layer can be arranged on the roughened surface of the underlayer conductor circuit. Such an interlaminar resin insulating layer may be formed by using an adhesive for electroless plating. The adhesive for electroless plating is based on a thermosetting resin and may contain cured heat-resistant resin particles, heat-resistant resin particles soluble in an acid or oxidizing agent, inorganic particles, fibrous filler and the like, if necessary. Particularly, the adhesive for electroless plating is optimum to be formed by dispersing the cured heat-resistant resin particles soluble in the acid or oxidizing agent into the uncured heat-resistant resin hardly soluble in the acid or oxidizing agent. The heat-resistant resin particles are dissolved and removed by treating with the acid or oxidizing agent to form a roughened surface having octopus pot-shaped anchors in its surface. When the resin insulating layer is formed between the underlayer conductor circuit and the upperlayer conductor circuit, it is an interlaminar resin insulating layer.

As the thermosetting resin, use may be made of epoxy resin, phenolic resin, polyimide resin and the like. Moreover, when a part of the thermosetting group is photosensitized, it is favorable to conduct acrylation by reacting a part of the thermosetting group with methacrylic acid, acrylic acid or the like. Particularly, an acrylate of epoxy resin is optimum. As the epoxy resin, use may be made of novolac type epoxy resins such as phenol novolac type, cresol novolac type and the like, alicyclic epoxy resin modified with dicyclopentadiene and so on. To such a thermosetting resin may be added a thermoplastic resin such as polyether sulphone (PES), polysulphone (PFS), polyphenylene sulphone (PPS), polyphenylene sulfide (PPES), polyphenyl ether (PPE), polyether imide (PI) or the like.

As the heat-resistant resin particles, it is desirable to use at least one selected from the group consisting of (1) heat-resistant resin particles having an average particle size of not more than 10 $\mu$m, (2) aggregate particles of heat-resistant resin powder having an average particle size of not more than 2 $\mu$m, (3) a mixture of heat-resistant resin powder having an average particle size of 2~10 $\mu$m and heat-resistant resin powder having an average particle size of less than 2 $\mu$m, (4) false particles obtained by adhering at least one of heat-resistant resin powder and inorganic powder having an average particle size of not more than 2 $\mu$m to the surface of heat-resistant resin powder having an average particle size of 2~10 $\mu$m, (5) a mixture of heat-resistant resin powder having an average particle size of 0.1~0.8 $\mu$m and heat-resistant resin powder having an average particle size of more than 0.8 $\mu$m but less than 2 $\mu$m, and (6) heat-resistant resin powder having an average particle size of 0.1~1.0 $\mu$m. These particles form more complicated anchors. The roughened surface made from these particles is possible to have a maximum roughness (Rmax) of 0.1~20 $\mu$m.

As the heat-resistant resin particles soluble in the acid or oxidizing agent, use may be made of amino resin (melamine resin, urea resin, guanamine resin and the like), epoxy resin (it is most suitable to cure bisphenol type epoxy resin with an amine curing agent), bismaleimide triazine resin and so on. The mixing ratio of such heat-resistant resin particles is 5~50% by weight, desirably 10~40% by weight based on solid content of a matrix made from the heat-resistant resin.

As the uncured heat-resistant resin hardly soluble in the acid or oxidizing agent, it is desirable to use a resin composite of thermosetting resin and thermoplastic resin, or a resin composite of photosensitive resin and thermoplastic resin. The former is high in the heat resistance, while the latter can form an opening for via-hole through photolithography.

The mixing ratio of thermosetting resin (photosensitive resin)/thermoplastic resin is preferably 95/5~50/50. Within the above range, higher properties are obtained without damaging the heat resistance.

Plural resin insulating layers may be formed. For example, the lower layer is a reinforcing layer comprised of inorganic particles or fibrous filler and a base resin, and an upper layer is an adhesive layer for electroless plating. And also, the lower layer is formed by dispersing heat-resistant resin particles of 0.1~2.0 gm in average particle size soluble in the acid or oxidizing agent into heat-resistant resin hardly soluble in the acid or oxidizing agent, while the upper layer is an adhesive layer for electroless plating.

As the inorganic particle, use may be made of silica, alumina, talc and the like. As the fibrous filler, use may be made of at least one of calcium carbonate whisker, aluminum borate whisker, aramid fiber, carbon fiber and the like.

In the invention, a solder resist layer is formed on the roughened surface of the conductor circuit for solder pad.

The solder resist layer is favorable to have a thickness of 5~40 μm. When it is too thin, the solder resist layer does not act as a solder dam, while when it is too thick, it is difficult to form an opening portion for solder bump and also the solder resist layer contacts with a solder body to cause cracking in the solder body.

The solder resist layer made be made from various resins. For example, it may be formed by curing bisphenol A-type epoxy resin or its acrylate, or novolac type epoxy resin or its acrylate with an amine curing agent, an imidazole curing agent or the like.

Particularly, if it is intended to form a solder bump by forming an opening is formed in the solder resist layer, it is preferable to cure the novolac type epoxy resin or its acrylate with the imidazole curing agent. The solder resist layer made of such a resin has a merit that migration of lead (phenomenon of diffusing lead ion in the solder resist layer) is less.

And also, the resin formed by curing the acrylate of novolac type epoxy resin with the imidazole curing agent is excellent in the heat resistance and the resistance to alkali and is not degraded even at a temperature fusing the solder (about 200° C.) and does not decompose with a strong base plating solution as in nickel plating or gold plating. As the acrylate of novolac type epoxy resin, mention may be made of epoxy resin obtained by reacting glycidyl ether of phenol novolac or cresol novolac with acrylic acid or methacrylic acid and so on.

However, the solder resist layer made of the acrylate of novolac type epoxy resin is constituted with a resin having a rigid skeleton, so that it is apt to cause the peeling from the conductor circuit. The roughened surface according to the invention can advantageously prevent such a peeling.

The imidazole curing agent is desirable to be liquid at 25° C. because the uniform mixing is attained at such a liquid state. As such a curing agent, mention may be made of 1-benzyl-2-methyl imidazole (trade name: 1B2MZ), 1-cyanoethyl-2-ethyl-4-methyl imidazole (trade name: 2E4MZ-CN) and 4-methyl-2-ethyl imidazole (trade name: 2E4MZ).

It is desirable to form the solder resist composition by dissolving the resin and the curing agent in a solvent such as glycol ether or the like. When the solder resist layer is formed from such a composition, free oxygen is not generated and the surface of copper pad is not oxidized. And also, the toxicity to human body is less.

As the glycol ether solvent, there can be used a solvent having the following general formula:

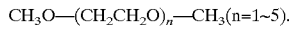

Preferably, at least one of diethylene glycol dimethyl ether (DMDG) and triethylene glycol dimethyl ether (DMTG) is used. Such a solven can completely dissolve a reaction initiator such as benzophenone, Michler's ketone or the like under warming at about 30~50° C. The amount of the solvent is favorable to be 10~40% by weight of the solder resist composition.

The addition amount of the imidazole curing agent is desirable to be 1~10% by weight per total solid content of the solder resist composition. When the addition amount is within the above range, the uniform mixing can easily be attained.

To the above solder resist composition may be added various anti-foaming agents and leveling agents, a thermosetting resin for improving the heat resistance and resistance to base and giving a flexibility, a photosensitive monomer for improving the resolution and the like.

As the leveling agent, a polymer of acrylic ester is favorable. As the initiator, Irgaquar I907 made by Ciba Geigy is favorable, and DETX-S made by Nippon Kayaku Co., Ltd. is favorable as a photosensitizer.

As the thermosetting resin, bisphenol type epoxy resin can be used. The bisphenol type epoxy resin includes bisphenol A-type epoxy resin and bisphenol F-type epoxy resin. The former is favorable in case of regarding the resistance to base as important, and the latter is favorable in case of requiring a low viscosity (regarding the applicability as important).

As the photosensitive monomer, a polyvalent acrulic monomer may be used. Because, the polyvalent acrylic monomer can improve the resolution. For example, use may be made of polyvalent acrylic monomers such as DPE-6A made by Nippon Kayaku Co. Ltd., R-604 made by Kyoeisha Kagaku Co., Ltd. and the like.

A coloring matter, pigment or the like may be added to such a solder resist composition because the wiring pattern can be shielded. As the coloring matter, it is desirable to use phthalocyanine green.

Furthermore, the solder resist composition is favorable to have a viscosity of 0.5~10 Pa·s, desirably 1~10 Pa·s at 25° C. because it is easily applied by means of a roll coater. After the solder resist layer is formed from such a composition, an opening portion may be formed by a light exposure and development treatment.

A method of producing the multilayer printed wiring board according to the invention will be described below. The following method is mainly a semi-additive method, but a full additive method may be adopted.

(1) At first, a wiring board is prepared by forming conductor circuits on a surface of a substrate. As the substrate, use may be made of a resin insulating substrate such as a glass epoxy substrate, a polyimide substrate, a bismaleimide triazine resin substrate or the like; a ceramic substrate; a metal substrate and so on.

The formation of the conductor circuits on the substrate can be carried out by a method wherein a copper clad laminate is subjected to an electroless plating or electrolytic plating and then etched, a method wherein an adhesive layer for electroless plating is formed on a substrate such as a glass epoxy substrate, a polyimide substrate, a ceramic substrate, a metal substrate or the like and the surface of the adhesive layer is roughened to from a roughened surface and then the roughened surface is subjected to an electroless plating, or so-called semi-additive method (a method wherein the full roughened surface is subjected to a thin electroless plating, and a plating resist is formed, and portions not forming the plating resist are subjected to a thick electrolytic plating, and the plating resist is removed, and the etching is carried out to form a conductor circuit composed of the electrolytic plated film and the electroless plated film). As the conductor circuit, a copper pattern is preferable.

In such a conductor circuit can be formed a roughened surface by using an etching solution containing copper(II) complex and an organic acid. As the copper(II) complex, it is favorable to use a copper(II) complex of an azole as previously mentioned. In the formation of the roughened surface, there can be used a method of spraying the etching solution onto the surface of the conductor circuit, or a method of immersing the conductor circuit in the etching solution and bubbling it. Moreover, the conductor circuit is desirably an electroless plated film or an electrolytic plated film. Because, it is difficult to form the roughened surface on a conductor circuit formed by etching a rolled copper foil.

The thus formed roughened surface may be covered with a metal layer made of a non-oxidizing metal or a metal not lowering the adhesion property between the metal layer and the resin or the adhesion property between the metal layer and the via-hole conductor even if the metal itself is oxidized. Such a metal layer can improve the adhesion property between the roughened surface and the resin insulating layer and the adhesion property between the roughened surface and the via-hole conductor because it does not form the oxide film on the roughened surface or does not lower the adhesion property between the metal layer and the resin insulating layer and the adhesion property between the metal layer and the via-hole conductor even if the oxide film is formed.

As the metal, mention may be made of metal or noble metal having a ionization tendency larger than copper but smaller than titanium. When the roughened surface is covered with a layer of such a metal or noble metal, there can be prevented the dissolution of the conductor circuit due to local electrode reaction in the roughening of the resin insulating layer. As the metal, use may be made of at least one metal selected from the group consisting of titanium, aluminum, zinc, iron, indium, thallium, cobalt, nickel, tin, lead, bismuth and noble metal. As the noble metal, gold, silver, platinum and palladium are used.

The metal layer made of such a metal can be formed on the roughened surface by using various methods. In this method, it is desirable to closely adhere the metal layer to the roughened surface so as to follow to the roughened surface. When the metal layer is closely adhered to the roughened surface, the oxidation of the roughened surface can efficiently be prevented and also the peeling between the conductor circuit and the inter-laminar resin insulating layer or the peeling between the conductor circuit and the via-hole conductor due to the peeling of the metal layer can be prevented.

In case of forming the metal layer made of a non-oxidizing metal such as nickel, tin, cobalt or noble metal, there can be used substitution plating, electroless plating, electrolytic plating, sputtering, vacuum deposition and the like. In case of the noble metal, the sputtering, vapor deposition and the like can be adopted.

Particularly, when tin is used, the substitution plating with copper is desirable. Tin can form a thin layer by electroless substitution plating with copper, so that it is advantageous to follow the metal layer to the roughened surface. In case of such Cu—Sn substitution reaction, Sn layer having a thickness of 0.1~2 $\mu$m can be formed on the roughened surface by using a solution of tin borofluoride-thiourea, tin chloride-thiourea or the like.

In the thus formed core board may be formed a through-hole. In this case, wiring layers on the front and rear surfaces of the board can electrically connected to each other through the through-hole. And also, the smoothness of the wiring board may be ensured by filling a low viscosity resin such as bisphenol F-type epoxy resin or the like in the through-hole and between the conductor circuits of the wiring board.

(2) An interlaminar resin insulating layer is disposed on the wiring board prepared in the item (1). The interlaminar resin insulating layer may be formed by applying an adhesive for electroless plating and drying it. The application of the adhesive for electroless plating can be carried out by using a roll coater, a curtain coater or the like.

At this time, the interlaminar resin insulating layer is formed over the full surface of the board, so that there is frequently caused such an uneven state that the thickness of the interlaminar resin insulating layer on the conductor circuit is thin and the thickness of the interlaminar resin insulating layer on a large area portion other than the conductor circuits is thick. Therefore, it is desirable to flatten the surface of the interlaminar resin insulating layer by pushing the interlaminar resin insulating layer of such an uneven state with a metal plate or a metal roll under heating.

(3) Then, the interlaminar resin insulating layer is cured, while an opening for the formation of via-hole is formed therein. The curing treatment of the interlaminar resin insulating layer is conducted by thermosetting when the resin matrix in the adhesive for electroless plating is a thermosetting resin, or by exposing to a ultraviolet ray in case of a photosensitive resin.

The opening for the formation of via-hole is formed by using a laser beam, an oxygen plasma or the like when the resin matrix in the adhesive for electroless plating is the thermosetting resin, or by light exposure and development treatment in case of the photosensitive resin. Moreover, the light exposure and development treatment is carried out after a photomask (glass substrate is favorable) depicted with a circle pattern for the formation of via-hole is placed on the photosensitive interlaminar resin insulating layer so as to adhere a side of the circle pattern thereto.

(4) Next, the surface of the interlaminar resin insulating layer (adhesive layer for electroless plating) provided with the opening for the formation of via-hole is roughened. Particularly, it is preferable to roughen the surface of the adhesive layer for electroless plating by dissolving and removing heat-resistant resin particles existing on the surface of the adhesive layer with an acid or an oxidizing agent. In this case, the depth of the recess portion formed in the roughened surface is favorable to be about 1~5 $\mu$m.

As the acid, use may made of an inorganic acid such as phosphoric acid, hydrochloric acid, sulfuric acid or the like, and an organic acid such as formic acid, acetic acid or the like. Among them, the use of the organic acid is favorable because it hardly corrode a metal conductor layer exposed from the via-hole in the roughening treatment. As the oxidizing agent, it is desirable to use chromic acid, permanganate (potassium permanganate or the like) and so on.

The roughened surface is favorable to have a maximum roughness (Rmax) of 0.1~20 $\mu$m. When it is too thick, the layer itself is easily damaged or peeled, while when it is too thin, the adhesion property lowers. Particularly, the roughness is favorable to be 0.1~5 $\mu$m in case of the semi-additive method because the electroless plated film is removed while ensuring the adhesion property.

(5) A catalyst nucleus is applied to the roughened surface of the interlaminar resin insulating layer. In the application of the catalyst nucleus, it is desirable to use a noble metal ion, a noble metal colloid or the like, and palladium chloride or palladium colloid is generally used. Moreover, it is desirable to conduct a heating treatment for fixing the catalyst nucleus. As the catalyst nucleus, palladium is preferable.

(6) A thin electroless plated film is formed on a whole surface of the interlaminar resin insulating layer roughened and provided with the catalyst nucleus. The electroless plated film is preferably an electroless copper plated film and has a thickness of 1~5 $\mu$m, preferably 2~3 $\mu$m. Moreover, a liquid composition adopted in the usual manner can be used as an electroless copper plating solution. For example, a liquid composition (pH=11.5) comprising copper sulfate: 29 g/L, sodium carbonate: 25 g/L, EDTA: 140 g/L, sodium hydroxide: 40 g/L and 37% formaldehyde: 150 mL is favorable.

(7) A photosensitive resin film (dry film) is laminated on the thus formed electroless plated film and a photomask (glass substrate is favorable) depicted with a plating resist pattern is closely placed on the photosensitive resin film, which are subjected to light exposure and development treatment to form non-conductor portions of the plating resist pattern.

(8) Then, an electrolytic plated film is formed on the electroless plated film other than the non-conductor portions to form conductor portions comprised of conductor circuits and via-holes. As the electrolytic plating, it is desirable to use an electrolytic copper plating, and the thickness is favorable to be 10~20 $\mu$m.

(9) After the plating resist on the non-conductor portions is removed, the electroless plated film is further dissolved and removed with a mixed solution of sulfuric acid and hydrogen peroxide or an etching solution of sodium persulfate, ammonium persulfate, iron chloride, copper chloride or the like to obtain independent conductor circuits of two layer structure comprised of the electroless plated film and the electrolytic plated film and via-holes. Moreover, the palladium catalyst nucleus exposed on the non-conductor portion of the roughened surface is removed by dissolving with chromic acid or the like.

(10) Next, roughened surfaces are formed on the thus obtained conductor circuits and via-holes. This roughened surface may be the same as formed by the aforementioned etching treatment according to the invention.

(11) Further, an interlaminar resin insulating layer is formed on the board according to the step of the item (2).

(12) If necessary, the steps of the items (3)~(9) are repeated for the formation of multilayer, whereby a multilayer printed wiring board can be produced.

And also, the thus formed roughened surface may be subjected to subsequent etching treatment, polishing treatment, oxidation treatment, oxidation-reduction treatment and the like, or may be covered with a plated film. On the conductor circuit having such a roughened surface may be formed the interlaminar resin insulating layer, via-hole conductor and solder resist layer as previously mentioned.

Although the above treatments are mainly the semi-additive method, even in so-called full additive method wherein the adhesive layer for electroless plating is roughened and the plating resist is formed thereon and the electroless plating is carried out to form a conductor pattern, the roughened surface according to the invention can be formed on the surface of the underlayer conductor circuit and thereafter the metal layer of non-oxidizing metal or the like according to the invention may be applied.

And also, the roughened surface according to the invention can be adopted even in the multilayer printed wiring board produced as shown in FIGS. 13~19. FIGS. 13~19 show production steps in an embodiment of the multilayer printed wiring board. Moreover, the roughened surface in the illustrated multilayer printed wiring board is covered with the metal layer, but it can be produced without forming the metal layer.

Figure 13:
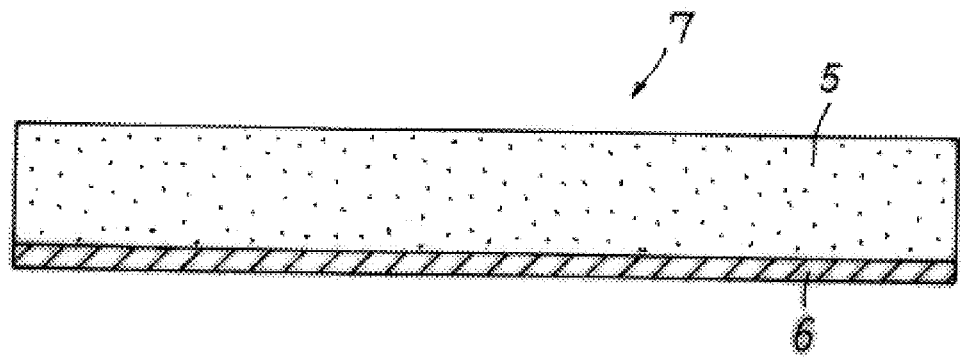
FIG. 13 is a step of producing an embodiment of the multilayer printed wiring board according to the invention.
Figure 14:
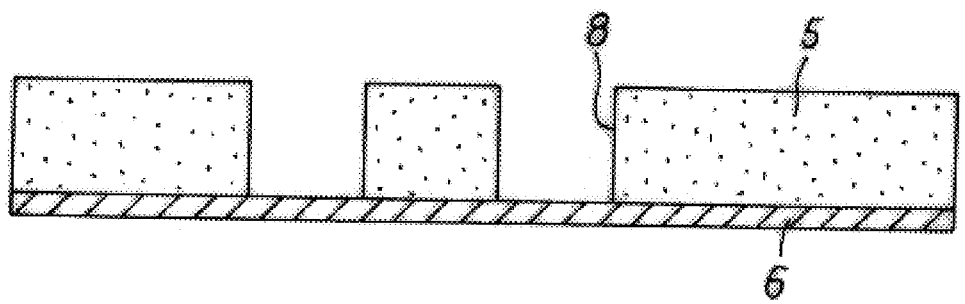
FIG. 14 is a step of producing an embodiment of the multilayer printed wiring board according to the invention.
Figure 15:
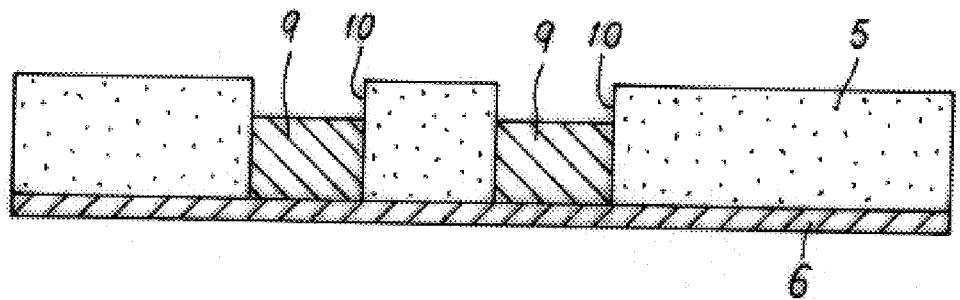
FIG. 15 is a step of producing an embodiment of the multilayer printed wiring board according to the invention.
Figure 16:
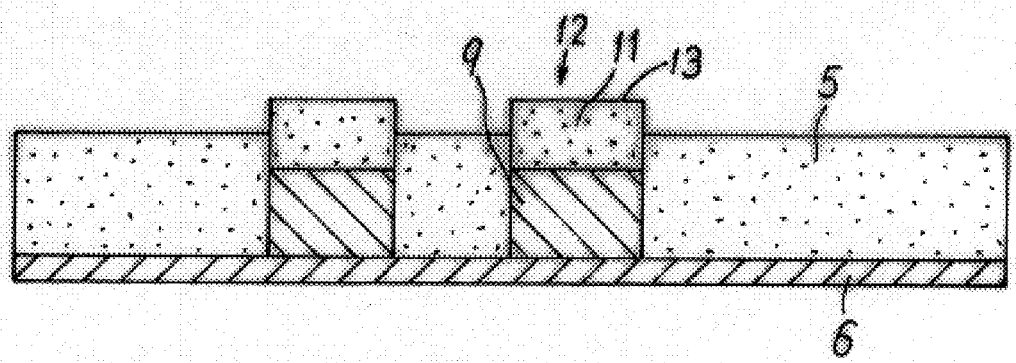
FIG. 16 is a step of producing an embodiment of the multilayer printed wiring board according to the invention.

A board 7 as shown in FIG. 13 is obtained by laying a metal foil 6 on one side of a resin substrate 5. As shown in FIG. 14, opening portions 8 are formed by subjecting the board 7 to a laser work, and then an electrolytic plating is carried out by using the metal foil 6 as a plating lead to form an electrolytic plated film 9 in a part of the opening portion 8 as shown in FIG. 15. Next, as shown in FIG. 16, a conductive paste 11 is filled in the remaining part of the opening portion 8 to form a via-hole 12 and at the same time, a protruded conductor 13 made of the conductive paste 11 is formed on the via-hole 12.

Figure 17:
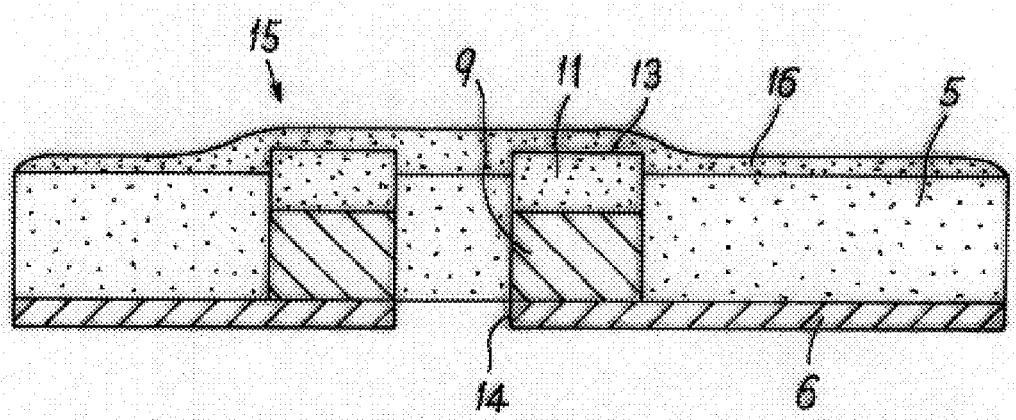
FIG. 17 is a step of producing an embodiment of the multilayer printed wiring board according to the invention.

Then, the metal foil 6 is etched to form a conductor circuit 14, whereby a one-sided circuit board 15 is prepared as shown in FIG. 17. Moreover, an uncured thermosetting resin 16 such as epoxy resin, polyimide resin, phenolic resin or the like is applied or an uncured resin film is placed on a surface of the one-sided circuit board 15 provided with the protruded conductors 13.

Figure 18:
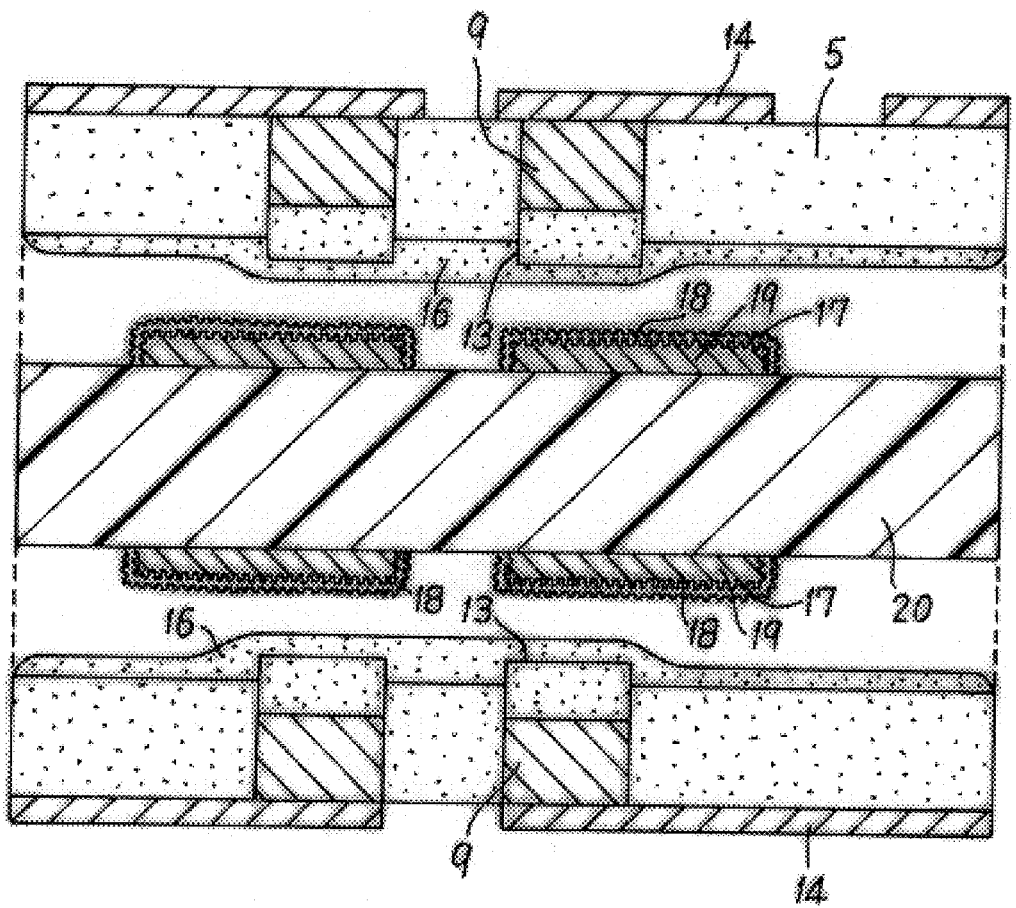
FIG. 18 is a step of producing an embodiment of the multilayer printed wiring board according to the invention.

As shown in FIG. 18, the one-sided circuit board 15 is placed onto each face of a board 20 having conductor circuits 19 with a roughened surface 17 according to the invention covered with a metal layer 18, which are united by hot pressing.

Figure 19:
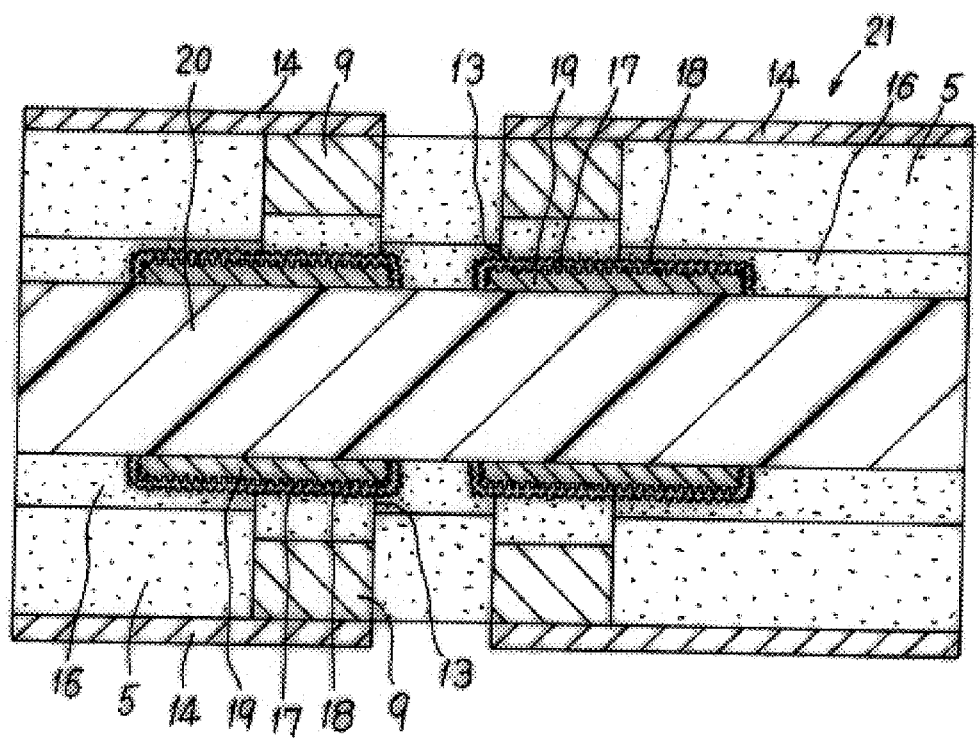
FIG. 19 is a step of producing an embodiment of the multilayer printed wiring board according to the invention.

In FIG. 19 is shown the thus produced multilayer printed wiring board 21. In this wiring board 21, the pressed protruded conductor 13 pushes away the resin 16 to contact with the conductor circuits 19 on the roughened surface 17 according to the invention through the metal layer 18. The resin 16 is softened by heating at once, but the roughened surface 17 according to the invention easily flows the resin 16, so that there is not caused the poor continuity due to the resin residue. And also, the metal layer 18 according to the invention improves the adhesion property of the roughened surface 17 and can strengthen the roughened surface 17.

Further, the roughened surface according to the invention can be adopted even in the multilayer printed wiring board produced by laying a resin adhered copper foil called as RCC. In the roughened surface according to the invention, the resin hardly remains, so that there is no poor continuity even in the thus produced multilayer printed wiring board.

In the production of such a multilayer printed wiring board, the resin adhered copper foil is laid onto the surface of the conductor circuit having the roughened surface according to the invention and the copper foil corresponding to via-hole forming portions is removed by etching and the resin is removed by irradiating a laser beam to from opening portions for via-holes, which are desmeared (removal of remaining resin) with an aqueous solution of an oxidizing agent such as aqueous solution of chromic acid, permanganate or the like and subjected to a plating to form via-holes.

The invention will be described with respect to examples and comparative examples with reference to the accompanying drawings.

EXAMPLE 1

Preparation of Adhesive for Electroless Plating (1) 35 parts by weight of 25 wt % acrylated product of creasol novolac type epoxy resin (made by Nippon Kayaku Co., Ltd. molecular weight: 2500) is mixed with 3.15 parts by weight of a photosensitive monomer (Aronics M315, trade name, made by Toa Gosei Co., Ltd.), 0.5 part by weight of an anti-foaming agent (S-65 made by Sannopuco Co., Ltd.) and 3.6 parts by weight of N-methylpyrolidone (NMP) under stirring.

(2) 12 parts by weight of polyether sulphone (PES) is mixed with 7.2 parts by weight of epoxy resin particles (Polymerpol, trade name, made by Sanyo Kasei Co., Ltd.) having an average particle size of 1.0 $\mu$m and 3.09 parts by weight of the same particles having an average particle size of 0.5 $\mu$m and further added with 30 parts by weight of NMP, which are mixed in a bead mill under stirring.

(3) 2 parts by weight of an imidazole curing agent (2E4MZ-CN, trade name, made by Shikoku Kasei Co., Ltd.) is mixed with 2 parts by weight of a photoinitiator (Irgaquar I-907, made by Ciba Geigy), a photosensitizer (DETX-S, made by Nippon Kayaku Co., Ltd.) and 1.5 parts by weight of NMP under stirring.

(4) The mixtures (1)~(3) are mixed to obtain an adhesive composition for electroless plating.

Preparation of Resin Filler (1) 100 parts by weight of bisphenol F-type epoxy monomer (YL983U, trade name, made by Yuka Shell Co., Ltd.

molecular weight: 310) is kneaded with 170 parts by weight of $SiO_2$ spherical particles having an average particle size of 1.6 μm and coated with a silane coupling agent [CRS 1101-CE, made by Adomatech Co., Ltd. size of maximum particle is not more than a thickness of an innerlayer copper pattern (15 μm) as mentioned below] and 1.5 parts by weight of a leveling agent (Perenol S4, trade name, made by Sannopuco Co., Ltd.) through three rolls to adjust a viscosity of the resulting mixture to 45,000~49,000 cps at 23±1° C.

(2) 6.5 parts by weight of an imidazole curing agent (2E4MZ-CN, trade name, made by Shikoku Kasei Co., Ltd.)

(3) The mixture of the item (1) and the substance of the item 82) are mixed to prepare a resin filler.

Production of Printed Wiring Board

Another embodiment of the printed wiring board according to the invention is produced according to production steps shown by longitudinal section views in FIGS. 20~32.

(1) As shown in FIG. 20, a copper clad laminate 24 formed by laminating copper foils 23 of 18 μm on both surfaces of a substrate 22 of 1 mm in thickness made of a glass epoxy resin or bismaleimide triazine (BT) resin is used as a starting material in this example.

(2) At first, a drilled hole 25 as shown in FIG. 25 is formed in the copper clad laminate 24, which is subjected to electroless plating and electrolytic plating and further the copper foils 23 are etched in a pattern form in the usual manner to form innerlayer copper pattern (underlayer conductor circuit) 26 of 25 μm in thickness on both surfaces of the substrate 22 and a through-hole 27.

Then, roughened surfaces 28, 29, 30 are formed on the surface of the innerlayer copper pattern 26 and land surface and inner wall face of the through-hole 27 to produce a wiring board 31 as shown in FIG. 21. The roughened surfaces 28, 29, 30 are formed by washing the substrate with water, drying, and spraying an etching solution onto both surfaces of the substrate to etch the surface of the innerlayer copper pattern 26 and the land surface and inner wall face of the through-hole 27. As the etching solution is used a mixture of 10 parts by weight of imidazole copper(II) complex, 7 parts by weight of glycolic acid, 5 parts by weight of potassium chloride and 78 parts by weight of deionized water.

(3) As shown in FIG. 22, resin layers 32,33 are formed between the innerlayer copper patterns 26 of the wiring board 31 and in the through-hole 27. The resin layers 32, 33 are formed by applying the previously prepared resin filler onto both surfaces of the wiring board 31 by means of a roll coater to fill between the innerlayer copper patterns 26 and in the through-hole 27 and then subjecting to a heating treatment at 100° C. for 1 hour, 120° C. for 3 hours, 150° C. for 1 hour and 180° C. for 7 hours.

(4) One-side surface of the board treated in the item (3) is polished by a belt sander. This polishing is carried out by using #600 belt polishing paper (made by Sankyo Rika Co., Ltd.) so as not to leave the resin filler on the roughened surface 28 of the innerlayer copper pattern 26 and the roughened surface 29 of a land of the through-hole 27. Then, buffing is carried out for removing flaw created by the belt sander polishing. Such a series of the polishing treatments is applied to the other surface of the board to obtain a wiring board 34 as shown in FIG. 22.

In the wiring board 34, the resin layer 32 is formed between the innerlayer copper patterns 26 and the resin layer 33 is formed in the through-hole 27. Since the roughened surface 28 of the innerlayer copper pattern 26 and the roughened surface 29 of the land of the through-hole 27 are removed, both surfaces of the board are flattened by the resin filler. The resin layer 32 is closely adhered to the roughened surface 28a at a side face of the innerlayer copper pattern 26 or the roughened surface 29a at a side face of the land of the through-hole 27, while the resin layer 33 is closely adhered to the roughened surface 30 at the inner wall of the through-hole 27.

(5) Further, roughened surfaces 35, 36 having a depth of 3 μm are formed by roughening the exposed innerlayer copper pattern 26 and upper land surface of the through-hole 27 according to the etching treatment of the item (2) as shown in FIG. 23.

When the thus formed roughened surface is observed just above and obliquely from above at an angle of 45° by means of an electron scanning microscope as shown in FIGS. 2 and 3, it has been observed that anchor portions 1 as shown in FIGS. 4~8 are 11 on average, recess portions 2 are 11 on average and the number of the ridgelines 3 is 22 on average at a region of 25 μm².

The roughened surfaces 35, 36 are subjected to tin substitution plating to form Sn layers 4 having a thickness of 0.3 μm as shown in FIGS. 9~12. The substitution plating is carried out by subjecting the roughened surface to Cu—Sn substitution reaction under conditions of tin borofluoride: 0.1 mol/L, thiourea: 1.0 mol/L, temperature: 50° C. and pH=1.2 (Sn layer is not shown in FIGS. 23~32).

(6) The previously prepared adhesive for electroless plating is applied onto both surfaces of the thus obtained wiring board by means of a roll coater. After the board is left to stand at a horizontal state for 20 minutes, the adhesive is dried at 60° C. for 30 minutes to form an adhesive layer 37 having a thickness of 35 μm as shown in FIG. 24.

(7) As shown in FIG. 25, a photomask film 39 depicted with a black circle 38 of 85 μmφ is adhered onto each surface of the wiring board provided with the adhesive layer 37 in the item (6). The wiring board is exposed to a super-high pressure mercury lamp at 500 mJ/cm².

Then, the wiring board is developed by spraying DMDG solution to form an opening 40 for via-hole of 85 μmφ in the adhesive layer 37 as shown in FIG. 26. Further, the wiring board is exposed to a super-high pressure mercury lamp at 3000 mJ/cm2 and subjected to a heating treatment at 100° C. for 1 hour and 150° C. for 5 hours to form an opening (opening for the formation of via-hole) having an excellent size accuracy corresponding to the photomask film. Moreover, the adhesive layer 37 of 35 μm in thickness acts as an interlaminar insulating layer, and the tin plated layer (not shown) on the innerlayer copper pattern 26 is partly exposed in the opening 40 for the formation of via-hole.

(8) Next, the board treated in the item (7) is immersed in chromic acid for 1 minute to remove epoxy resin particles existing on the surface of the adhesive layer 37. By this treatment are formed roughened surfaces 41, 42 on the surface of the adhesive layer 37 and the inner wall face of the opening for via-hole as shown in FIG. 27. Thereafter, the thus obtained board 43 is immersed in a neutral solution (made by Shipley) and then washed with water.

Further, a catalyst nucleus is given to the roughened surface 41 of the adhesive layer 37 and the roughened surface 42 of the opening for via-hole by applying a palladium catalyst (made by Atotech Co., Ltd.) to the roughened surface of the wiring board.

(9) The thus obtained board is immersed in an electroless copper plating bath under the following conditions to from an electroless copper plated film 44 of 1.6 μm in thickness over a whole of the roughened surface as shown in FIG. 28.

Electroless Plating Solution;
EDTA: 150 g/L
copper sulfate: 20 g/L
HCHO: 30 mL/L
NaOH: 40 g/L
α,α'-bipirydyl: 80 mg/L
PEG: 0.1 g/L
Electroless Plating Conditions;
liquid temperature of 70° C., 30 minutes

Figure 29:
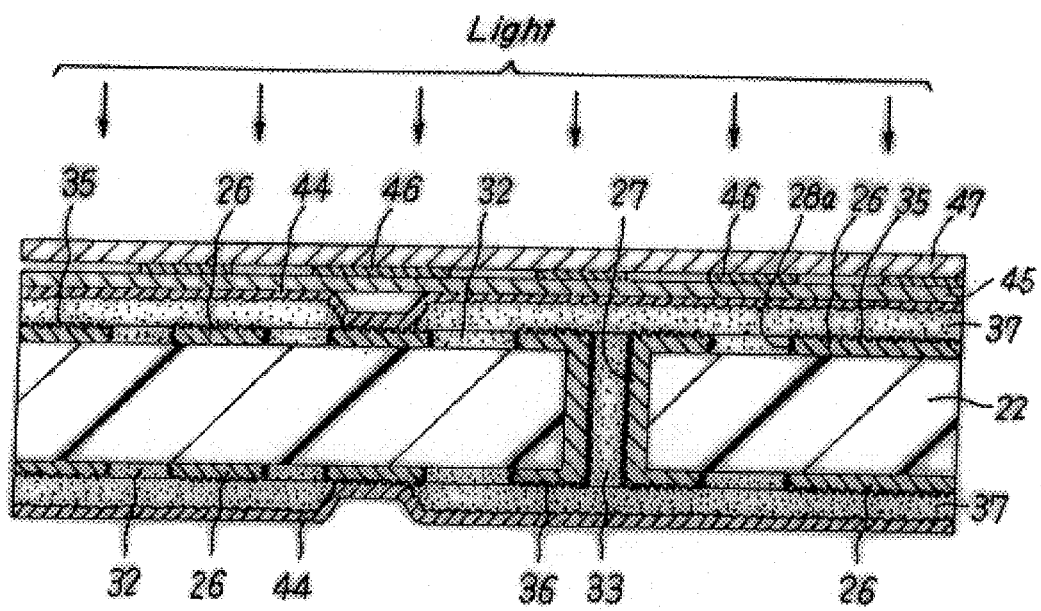
FIG. 29 is a step of producing another embodiment of the multilayer printed wiring board according to the invention.
Figure 30:
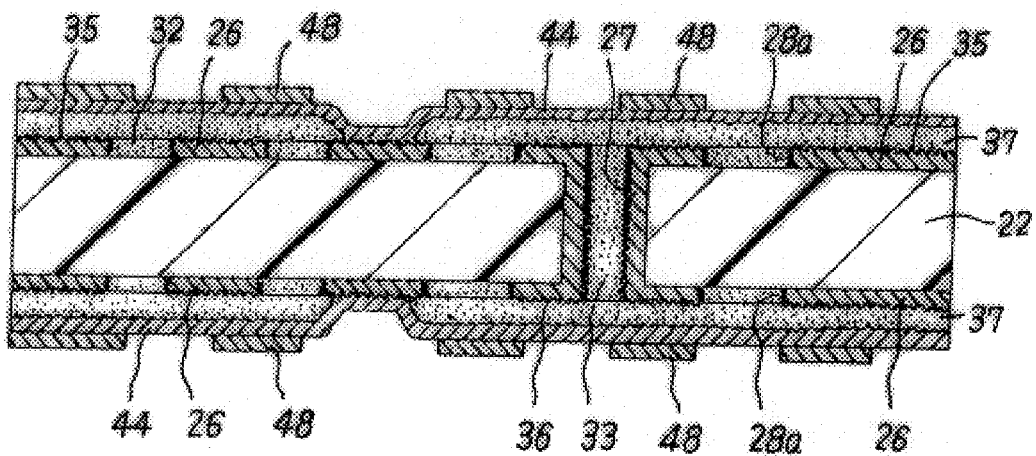
FIG. 30 is a step of producing another embodiment of the multilayer printed wiring board according to the invention.

(10) As shown in FIG. 29, a commercially available photosensitive dry film 45 is laid on the electroless copper plated film 44, and a mask film 47 printed with a pattern 46 is placed thereon. The board is exposed to a light at 100 mJ/cm$^2$ and developed with 0.8% sodium carbonate to form a plating resist 48 having a thickness of 15 μm as shown in FIG. 30.

Figure 31:
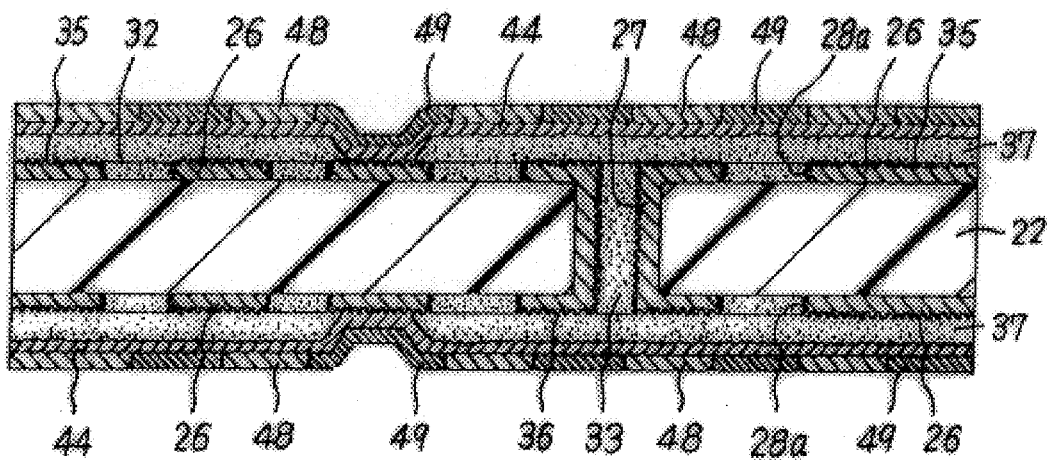
FIG. 31 is a step of producing another embodiment of the multilayer printed wiring board according to the invention.

(11) The thus obtained board is subjected to an electrolytic copper plating under the following conditions to form an electrolytic copper plated film 49 having a thickness of 15 μm as shown in FIG. 31.
Electrolytic Plating Solution;
sulfuric acid: 180 g/L
copper sulfate: 80 g/L
additive: 1 ML/L
(Kaparasid GL, trade name, made by Atotech Japan)
Electrolytic Plating Conditions;
current density: 1 A/dm$^2$
time: 30 minutes
temperature: room temperature

Figure 33:
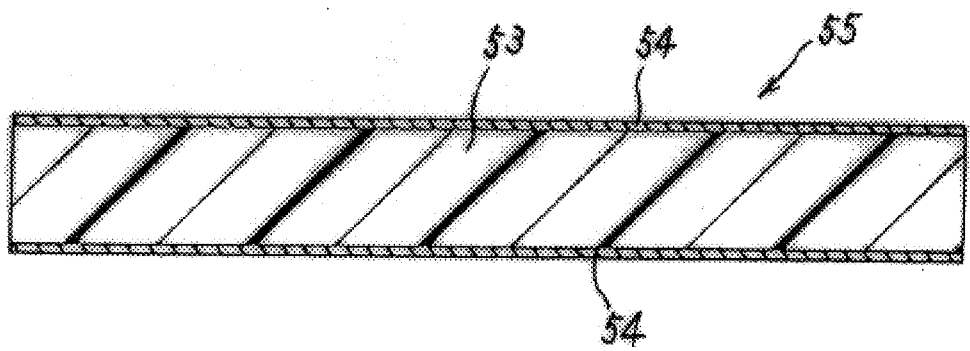
FIG. 33 is a step of producing the other embodiment of the multilayer printed wiring board according to the invention.

(12) After the plating resist 48 is peeled and removed with 5% KOH, the electrolytic plated film 44 existing beneath the plating resist 48 is dissolved and removed by etching with a mixed solution of sulfuric acid and hydrogen peroxide. Thus, there is obtained conductor circuits 50 (including via-hole 51) having a thickness of 18 μm and comprised of the electroless copper plated film 44 and the electrolytic copper plated film 49 as shown in FIG. 33.

Figure 32:
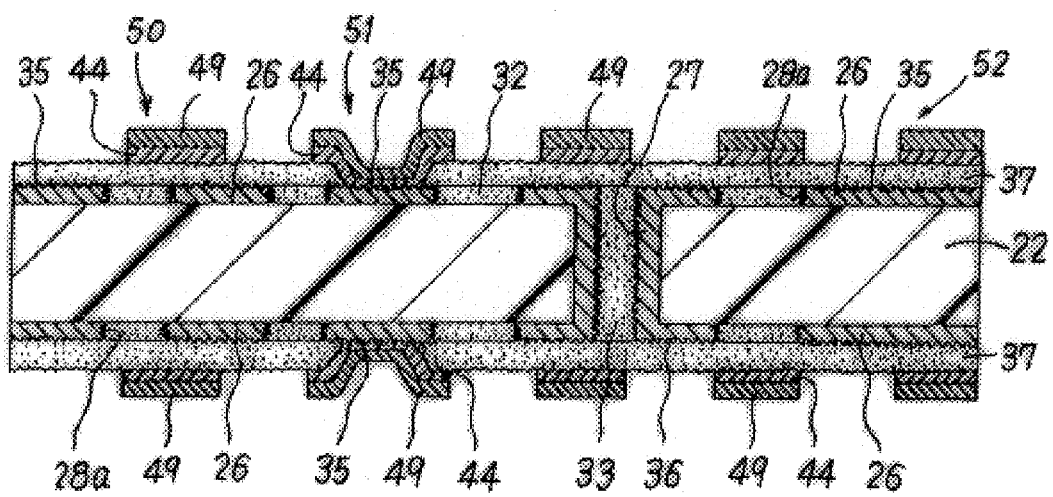
FIG. 32 is a step of producing another embodiment of the multilayer printed wiring board according to the invention.

Further, the board is immersed in 80 g/L of chromic acid at 70° C. for 3 minutes to etch the surface of the adhesive layer 37 for electroless plating between the conductor circuits 50 by 1 μm, whereby the palladium catalyst is removed from the surface to produce a multilayer printed wiring board 52 as shown in FIG. 32.

Heating Test and Heat Cycle Test

With respect to the thus obtained wiring board are made a heating test at 128° C. for 48 hours and a test of 500 heat cycles of −55° C.~125° C. After each test, the peeling between the interlaminar resin insulating layer and the underlayer conductor circuit and the change ratio of resistance in the via-hole portion are measured. The results are shown in Table 1.

EXAMPLE 2

A core board 31 having a roughened surface of a conductor circuit as shown in FIG. 21 is prepared by conducting the steps (1) and (2) of Example 1. On the other hand, there is prepared a one-sided circuit board 15 as shown in FIGS. 13~17.

Concretely, the one-sided circuit board 15 is prepared as follows. A copper foil 6 of 12 μm in thickness is laid on a glass epoxy substrate 5 to obtain a one-side copper clad laminate 7 as shown in FIG. 13, and a surface of the laminate 7 not covered with the copper foil 6 is exposed to a carbon dioxide gas laser beam to form an opening portion 8 having a diameter of 50 μm as shown in FIG. 14.

Then, the laminate 7 is subjected to an electrolytic plating under the condition in the item (11) of Example 1 to form an electrolytic plated film 9 as shown in FIG. 15. Thereafter, a stainless print mask having an opening of 1.0 μm in diameter corresponding to a position for the formation of via-hole is placed and a gold-Pd conductive paste (TR-4931, made by Tanaka Kikinzoku Co., Ltd.) is printed to fill in the opening portion 8 and form a protruded conductor 13 having a height of 20 μm as shown in FIG. 16.

Then, a dry film is laid on the surface of the copper foil 5 exposed to a ultraviolet ray and developed to form an etching resist, and the copper foil 6 is removed by etching with an aqueous solution of sulfuric acid-hydrogen peroxide to form a conductor pattern 14. Thereafter, cresol novolac type epoxy resin 16 is applied to the surface provided with the protruded conductor 13 and dried at 60° C. for 120 minutes to obtain the one-sided circuit board 15 as shown in FIG. 17.

The one-sided circuit board 15 is placed on each surface of the core board 31 as shown in FIG. 21 and united together by pressing at 150° C. under a pressure of 10 kg/cm$^2$ to produce a multilayer printed wiring board as shown in FIG. 19. Moreover, the roughened surface is not covered with the metal layer in this multilayer printed wiring board. With respect to the thus obtained wiring board are made the heating test and heat cycle test in the same manner as in Example 1. The results are shown in Table 1.

EXAMPLE 3

The same procedure as in Example 1 is repeated except that tin substitution is not carried out on the roughened surface of the underlayer conductor circuit and the metal layer made from the other non-oxidizing metal or the like is not formed. With respect to the thus obtained wiring board are made the heating test and heat cycle test in the same manner as in Example 1. The results are shown in Table 2.

EXAMPLE 4

The same procedure as in Example 1 is repeated except that nickel plating with the following treating solution is carried out instead of Sn substitution.
nickel chloride: 30 g/L
sodium hypophosphite: 10 g/L
ammonium chloride: 50 g/L
pH: 8~10
temperature: 90° C.

With respect to the thus obtained wiring board are made the heating test and heat cycle test in the same manner as in Example 1. The results are shown in Table 2.

EXAMPLE 5

The same procedure as in Example 1 is repeated except that cobalt plating with the following treating solution (aqueous solution) is carried out instead of Sn substitution.
cobalt chloride: 0.6 g/L
sodium hypophosphite: 0.26 g/L
sodium tartarate: 0.9 g/L
ammonium chloride: 1.3 g/L
pH: 8~10
temperature: 90° C.

With respect to the thus obtained wiring board are made the heating test and heat cycle test in the same manner as in Example 1. The results are shown in Table 2.

EXAMPLES 6~14

The same procedure as in Example 1 is repeated except that Au film (Example 6), titanium film (Example 7), aluminum film (Example 8), zinc film (Example 9), iron film (Example 10), indium film (Example 11), thallium film (Example 12), lead film (Example 13) and bismuth film (Example 14) are formed by sputtering instead of Sn substitution, respectively. As a sputtering apparatus, SV-4540 made by Nippon Shinkuu Gijutsu Co., Ltd. is used.

As the sputtering conditions, Example 6 adopts atmospheric pressure of 0.6 Pa, temperature of 100° C., power of 200 W and 1 minute, and Examples 7 and 8 adopt atmospheric pressure of 0.6 Pa, temperature of 100° C., power of 200 W and 2 minutes, while Examples 9~12 and 14 adopt atmospheric pressure of 0.5 Pa, temperature of 100° C., power of 200 W and 1 minute, and Example 13 adopts atmospheric pressure of 0.5 Pa, temperature of 100° C., power of 300 W and 1 minute. With respect to the thus obtained wiring board are made the heating test and heat cycle test in the same manner as in Example 1. The results are shown in Table 2.

EXAMPLE 15

A core board 31 having a roughened surface of conductor circuit as shown in FIG. 21 is prepared by conducting the steps (1) and (2) of Example 1 likewise Example 2, which is treated in the same manner as in Example 2 to produce a multilayer printed wiring board 21 as shown in FIG. 19. In this example, the roughened surface 28 of the core board 31 is covered with a metal layer of palladium. The covering is carried out under the same conditions of Example 6. With respect to the thus obtained wiring board are made the heating test and heat cycle test in the same manner as in Example 1. The results are shown in Table 2.

EXAMPLE 16

Raw Composition for the Preparation of Adhesive for Electroless Plating (Adhesive for Upperlayer)
[Resin Composition A]

35 parts by weight of a resin solution of 25% acrylated product of cresol novolactype epoxy resin (made by Nippon Kayaku Co., Ltd. molecular weight: 2500) dissolved at a concentration of 80 wt % in DMDG is mixed with 3.15 parts by weight of a photosensitive monomer (Aronix M315, made by Toa Gosei Co., Ltd.), 0.5 part by weight of an anti-foaming agent (S-65, made by Sannopuco Co., Ltd.) and 3.6 parts by weight of NMP under stirring.
[Resin Composition B]

12 parts by weight of polyether sulphone (PES) is mixed with 7.2 parts by weight of epoxy resin particles (Polymerpol, made by Sanyo Kasei Co., Ltd.) having an average particle size of 1.0 μm and 3.09 parts by weight of the same particles having an average particle size of 0.5 μm and further added with 30 parts of NMP, which are mixed in a bead mill under stirring.
[Curing Agent Composition C]

2 parts by weight of an imidazole curing agent (2E4MZ-CN, made by Shikoku Kasei Co., Ltd.) is mixed with 2 parts by weight of a photoinitiator (Irgaquar I-907, made by Ciba Geigy), 0.2 part by weight of a photosensitizer (DETX-S, made by Nippon Kayaku Co., Ltd.) and 1.5 parts by weight of NMP under stirring.
Raw Composition for the Preparation of Interlaminar Resin Insulating Agent (Adhesive for Underlayer)
[Resin Composition D]

35 parts by weight of a resin solution of 25% acrylated product of cresol novolac type epoxy resin (made by Nippon Kayaku Co., Ltd. molecular weight: 2500) dissolved at a concentration of 80 wt % in DMDG is mixed with 4 parts by weight of a photosensitive monomer (Aronix M315, made by Toa Gosei Co., Ltd.), 0.5 part by weight of an anti-foaming agent (S-65, made by Sannopuco Co., Ltd.) and 3.6 parts by weight of NMP under stirring.
[Resin Composition E]

12 parts by weight of polyether sulphone (PES) is mixed with 14.49 parts by weight of epoxy resin particles (Polymerpol, made by Sanyo Kasei Co., Ltd.) having an average particle size of 0.5 μm and further added with 30 parts of NMP, which are mixed in a bead mill under stirring.
[Curing Agent Composition F]

2 parts by weight of an imidazole curing agent (2E4MZ-CN, made by Shikoku Kasei Co., Ltd.) is mixed with 2 parts by weight of a photoinitiator (Irgaquar I-907, made by Ciba Geigy), 0.2 part by weight of a photosensitizer (DETX-S, made by Nippon Kayaku Co., Ltd.) and 1.5 parts by weight of NMP under stirring.
Raw Composition for the Preparation of Resin Filler
[Resin Composition G]

100 parts by weight of bisphenol F-type epoxy monomer (YL983U, made by Yuka Shell Co., Ltd. molecular weight: 310) is mixed with 170 parts by weight of $SiO_2$ spherical particles having an average particle size of 1.6 μm and coated with a silane coupling agent (CRS 1101-CE, made by Adomatech Co., Ltd. size of maximum particle is not more than a thickness of an innerlayer copper pattern (15 μm) as mentioned below) and 1.5 parts by weight of a leveling agent (Perenol S4, made by Sannopuco Co., Ltd.) under stirring to adjust a viscosity of the resulting mixture to 45,000~49,000 cps at 23±1° C.
[Curing Agent Composition H]

6.5 parts by weight of an imidazole curing agent (2E4MZ-CN, trade name, made by Shikoku Kasei Co., Ltd.)
Production of Printed Wiring Board An embodiment of the printed wiring board according to the invention is produced according to production steps shown by longitudinal section views in FIGS. 33~50.

(1) As shown in FIG. 33, a copper clad laminate 55 formed by laminating copper foils 54 of 18 μm on both surfaces of a substrate 53 of 1 mm in thickness made of a glass epoxy resin or BT (bismaleimide triazine) resin is used as a starting material.

Figure 34:
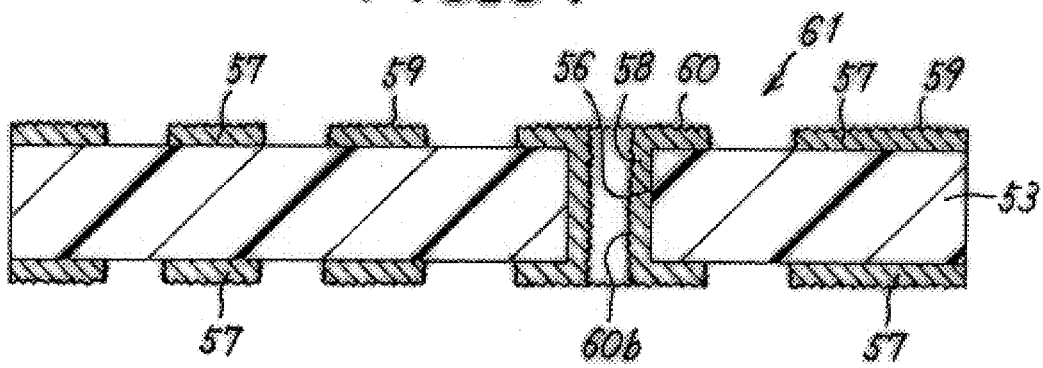
FIG. 34 is a step of producing the other embodiment of the multilayer printed wiring board according to the invention.

At first, a drilled hole 56 is formed in the copper clad laminate 55 and then an electroless plating treatment is carried out and etched in a pattern form to form innerlayer copper patterns 57 (underlayer conductor circuits) on both surfaces of the laminate 55 and a through-hole 58 as shown in FIG. 34.

(2) The board provided with the innerlayer copper pattern 57 and the through-hole 58 is washed with water, dried, and subjected to an oxidation-reduction treatment using NaOH (10 g/L), $NaClO_2$ (40 g/L) and $Na_3PO_4$ (6 g/L) as an oxidation bath and NaOH (10 g/L) and $NaBH_4$ (6 g/L) as a reduction bath to form roughened surfaces 59, 60 on the surfaces of the innerlayer copper pattern 57 and the through-hole 58, whereby there is produced a wiring board 61 as shown in FIG. 34.

(3) The raw composition for the preparation of resin filler is kneaded to obtain a resin filler. In 24 hours after the preparation, the resin filler is applied onto both surfaces of the board 61 by means a roll coater to fill between the conductor circuits 57 and in the through-hole 58, dried at 70° C. for 20 minutes, and the resin filler is filled between the conductor circuits 57 and in the through-hole 58 in the other surface in the same manner and dried at 70° C. for 20 minutes to form resin layers 62, 63.

(4) One-side surface of the board treated in the item 83) is polished by belt sander polishing using #600 belt polishing paper (made by Sankyo Rika Co., Ltd.) so as not to leave the resin filler on the surface of the innerlayer copper pattern 57 and the surface of a land 60 of the through-hole 58 and then buffed for removing flaw created by the above belt sander polishing. Such a series of the polishings are carried out to the other surface.

Figure 35:
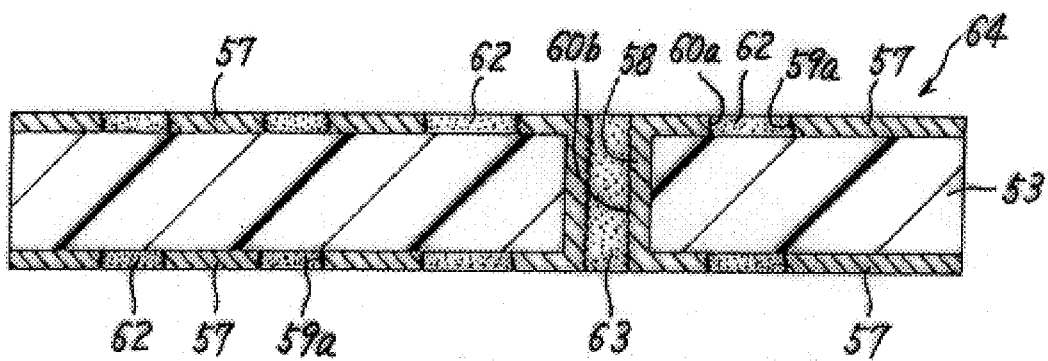
FIG. 35 is a step of producing the other embodiment of the multilayer printed wiring board according to the invention.

(5) Then, the resin filler is cured by a heating treatment at 100° C. for 1 hour, 120° C. for 3 hours, 150° C. for 1 hour and 180° C. for 7 hours to produce a wiring board 64 as shown in FIG. 35. In the wiring board 64, a surface portion of the resin filler filled in the through-hole 58 and the like and the roughened surfaces 59, 60 of upper part of the innerlayer conductor circuit 57 are removed to flatten both surfaces of the board, and the resin layer 62, side face of the innerlayer conductor circuit 57 and land surface of the through-hole 58 are strongly adhered to each other through the roughened surfaces 59a, 60a and the inner wall face of the through-hole 58 and the resin layer 63 are strongly adhered to each other tlrough the roughened surface 60a. That is, the surfaces of the resin layers 62, 63 and the surface of the innerlayer copper pattern 57 are the same plane at this step.

(6) The printed wiring board 64 provided with the conductor circuits is degreased with an alkali, soft-etched and treated with a catalyst solution containing palladium chloride and an organic acid to provide Pd catalyst, and after the activation of the catalyst, the board is immersed in an electroless plating solution of pH=9 containing $3.2 \times 10^{-2}$ mol/L of copper sulfate, $3.9 \times 10^{-3}$ mol/L of nickel sulfate, $5.4 \times 10^{-2}$ mol/L of sodium oxalate, $3.3 \times 10^{-1}$ mol/L of sodium hypophosphite and $1.1 \times 10^{-4}$ mol/L of a surfactant (Surfeel 465, made by Nisshin Kagaku Kogyo Co., Ltd.) and oscilated and rocked every 4 seconds after 1 minute of the immersion to form roughened layers 65, 66 of Cu—Ni—P needle alloy on the copper conductor circuits 57 and land surface of the through-hole 58.

Further, it is subjected to Cu—Sn substitution reaction under conditions of tin borofluoride: 0.1 mol/L, thiourea: 1.0 mol/L, temperature: 35° C. and pH=1.2 to form Sn layer of 0.3 μm in thickness on the surfaces of the roughened layers 65, 66. The Sn layer is not particularly shown.

(7) The raw composition for the preparation of interlaminar resin insulating material is mixed under stirring to adjust the viscosity to 1.5 Pa·s, whereby the interlaminar resin insulating material (for underlayer) is obtained. Then, the raw composition for the preparation of adhesive for electroless plating A is mixed under stirring to adjust the viscosity to 7 Pa·s, whereby the adhesive solution for electroless plating (for upperlayer) is obtained.

(8) Onto both surfaces of the board 67 of the item (6) is applied the interlaminar resin insulating material (for underlayer) having a viscosity of 1.5 Pa·s in 24 hours after the preparation of the item (7) by means of a roll coater and left to stand at a horizontal state for 20 minutes and dried (pre-baked) at 60° C. for 30 minutes, and then the photosensitive adhesive solution (for upperlayer) having a viscosity of 7 Pa·s is applied in 24 hours after the preparation of item (7), left to stand at a horizontal state for 20 minutes and dried (pre-baked) at 60° C. for 30 minutes to form an adhesive layer 68 having a thickness of 35 μm as shown in FIG. 37.

(9) A photomask film 70 printed with a black circle 69 of 85 μmφ is closely adhered onto each surface of the board provided with the adhesive layer 68 in the item (8) and exposed to a super-high pressure mercury lamp at 500 mJ/cm². The board is developed by spraying DMDG solution, exposed to a super-high pressure mercury lamp at 3000 mJ/cm² and subjected to a heating treatment (postbaking) at 100° C. for 1 hour, 120° C. for 1 hour and 150° C. for 3 hours to form an interlaminar resin insulating layer (two-layer structure) 68 of 35 μm in thickness having an opening (opening for the formation of via-hole) 71 of 85 μmφ having an excellent size accuracy corresponding to the photomask film 70 as shown in FIG. 39. Moreover, tin plated layer is partly exposed in the opening 71 for via-hole.

(10) The board provided with the opening 71 is immersed in chromic acid for 19 minutes to dissolve and remove the epoxy resin particles existing on the surface of the interlaminar resin insulating layer 68, whereby the surface of the interlaminar resin insulating layer 68 is roughened to from roughened surfaces 72, 73 as shown in FIG. 40 and thereafter it is immersed in a neutral solution (made by Shipley) and washed with water.

Further, a palladium catalyst (made by Atotech Co., Ltd.) is applied onto the surface of the board subjected to the roughening treatment (roughened depth: 6 μm) to provide a catalyst nucleus on the surface 72 of the interlaminar resin insulating layer 68 and the inner wall face 73 of the opening for via-hole.

(11) The thus formed wiring board is immersed in an aqueous electroless copper plating solution having the following composition to from an electroless copper plated film 74 of 0.6 μm in thickness over a full roughened surface as shown in FIG. 41.

[Aqueous Electroless Plating Solution]
EDTA 150 g/L
copper sulfate 20 g/L
HCHO 30 mL/L
NaOH 40 g/L
$\alpha,\alpha'$-bipyridyl 80 mg/L
PEG 0.1 g/L

[Electroless Plating Conditions]
liquid temperature of 70° C., 30 minutes

(12) As shown in FIG. 42, a commercially available photosensitive dry film 76 printed with a black circle 75 is laid on the electroless copper plated film 74 formed in the item (11) and a mask is placed thereon, which are exposed to a light at 100 mJ/cm² and developed with 0.8% sodium carbonate to form a plating resist 77 having a thickness of 15 μm as shown in FIG. 43.

Figure 44:
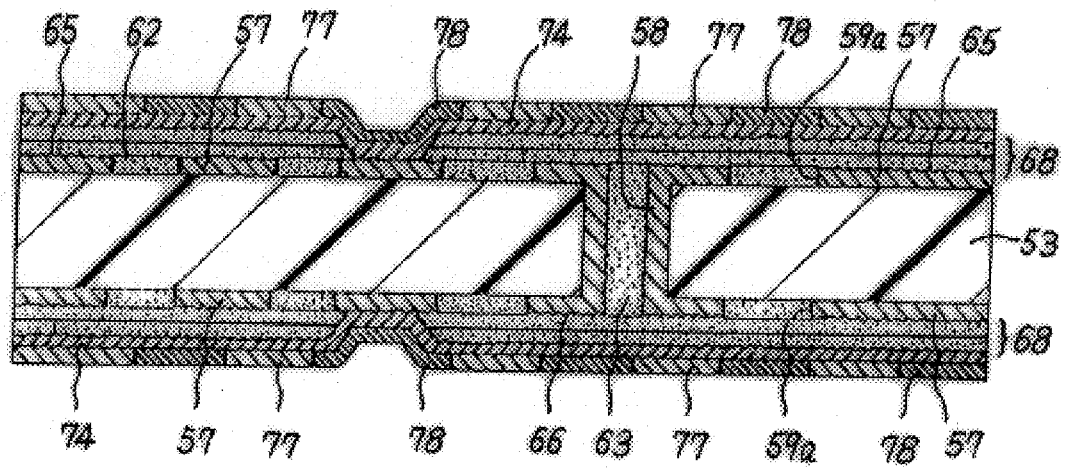
FIG. 44 is a step of producing the other embodiment of the multilayer printed wiring board according to the invention.

(13) Then, portions not forming the plating resist are subjected to an electrolytic copper plating under the following conditions to form an electrolytic copper plated film 78 having a thickness of 15 μm as shown in FIG. 44.

[Aqueous Electrolytic Plating Solution]
sulfuric acid 180 g/L
copper sulfate 80 g/L
additive (Kaparasid GL, made by Atotech Japan) 1 mL/L

[Electrolytic Plating Conditions]
current density 1 A/dm²
time 30 minutes
temperature room temperature

Figure 45:
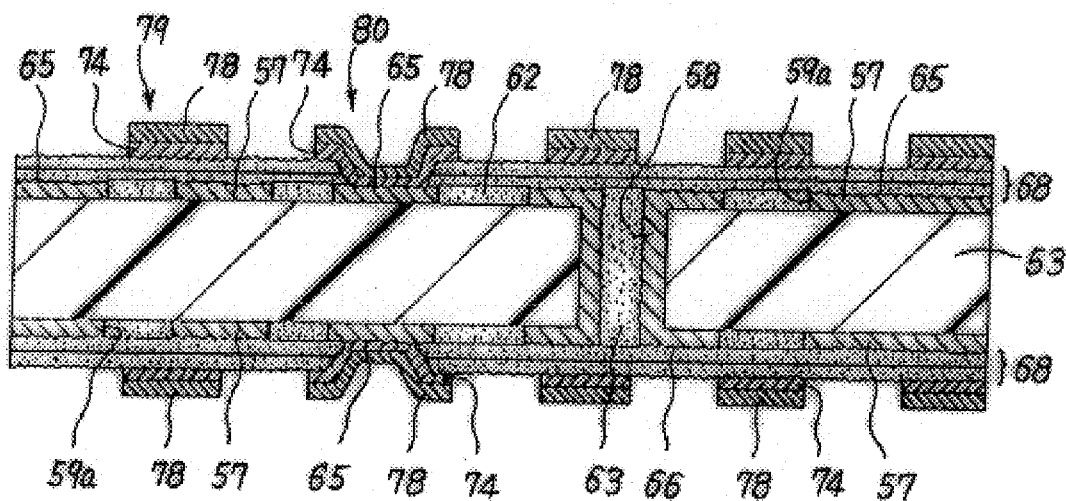
FIG. 45 is a step of producing the other embodiment of the multilayer printed wiring board according to the invention.

(14) After the plating resist 77 is peeled and removed with 5% KOH, the electroless plated film 74 located beneath the plating resist 77 is dissolved and removed by etching with a mixed solution of sulfuric acid and hydrogen peroxide to from conductor circuits 79 (including via-hole 80) having a thickness of 18 μm and comprised of the electroless copper plated film 74 and the electrolytic copper plated film 78 as shown in FIG. 45.

(15) The same procedure as in the item (6) is repeated to form a Cu—Ni—P roughened surface, and the surface is subjected to Sn substitution.

(16) The steps (7)~(15) are repeated to further form upperlayer conductor circuits, whereby a multilayer wiring board is obtained.

Figure 46:
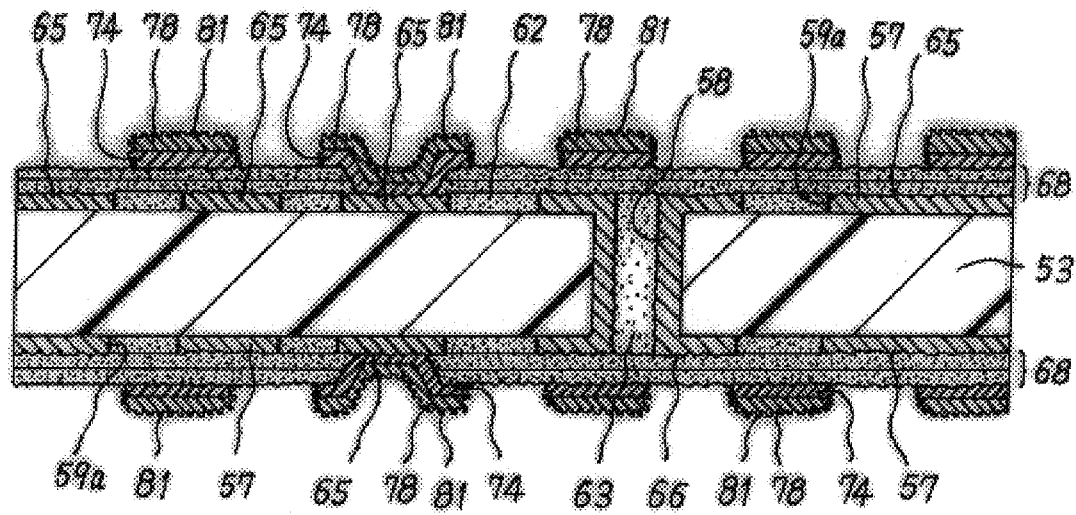
FIG. 46 is a step of producing the other embodiment of the multilayer printed wiring board according to the invention.

(17) The conductor circuit as a surface layer is etched by spraying an etching solution containing 10 parts by weight of imidazole copper(II) complex, 7 parts by weight of glycolic acid and 5 parts by weight of potassium chloride or "Mechetchbond" trade name, made by Mech Co., Ltd. and transferring through rolls to form a roughened surface 81 having a thickness of 3 $\mu$m as shown in FIG. 46. In this case, Sn substitution is not carried out in the roughened surface.

When the roughened surface is measured just above by means of an electron scanning microscope (×5000), the anchor portions 1 as shown in FIGS. 4~8 are 11 on average, the recess portions are 11 on average and the ridgelines are 22 on average in a region of 25$\mu$m$^2$.

(18) On the other hand, a solder resist composition is obtained by mixing 46.67 g of a photosensitized oligomer wherein 50% of epoxy group in 60% by weight of cresol novolac type epoxy resin (made by Nippon Kayaku Co., Ltd.) dissolved in DMDG is acrylated, 15.0 g of 80% by weight of bisphenol A-type epoxy resin (Epikote 1001, made by Yuka Shell Co., Ltd.) dissolved in methyl ethyl ketone, 1.6 g of an imidazole curing agent (2E4MZ-CN, made by Shikoku Kasei Co., Ltd.), 3 g of a polyvalent acryl monomer (R604, made by Nippon Kayaku Co., Ltd.) as a photosensitive monomer, 1.5 g of polyvalent acryl monomer (DPE6A, made by Kyoeisha Kagaku Co., Ltd.) and 0.71 g of an anti-foaming agent (S-65, made by Sannopuco Co., Ltd.) and further adding with 2 g of benzophenone (made by Kanto Kagaku Co., Ltd.) as a photoinitiator and 0.2 g of Michler's ketone (made by Kanto Kagaku Co., Ltd.) as a photosensitizer to adjust the viscosity to 2.0 Pa·s at 25° C. Moreover, the viscosity is measured by B-type viscometer (DVL-B model, made by Tokyo Keiki Co., Ltd.) with rotor No. 4 in case of 60 rpm or rotor No. 3 in case of 6 rpm.

Figure 47:
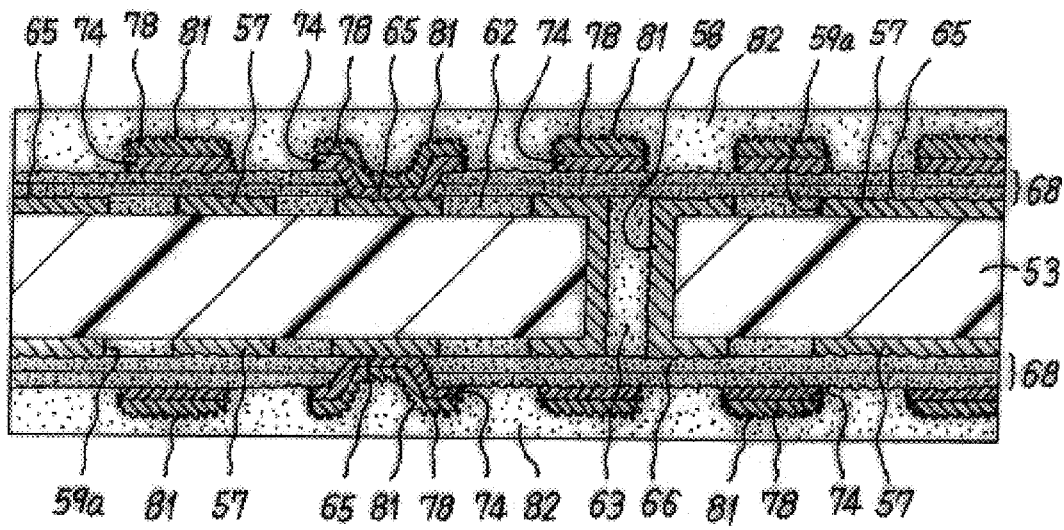
FIG. 47 is a step of producing the other embodiment of the multilayer printed wiring board according to the invention.

(19) The solder resist composition 82 is applied at a thickness of 20 m onto both surfaces of the multilayer wiring board obtained in the item (16) as shown in FIG. 47. After the drying treatment at 70° C. for 20 minutes and 70° C. for 30 minutes, a photomask film 84 of 5 mm in thickness depicted with a circle pattern (mask pattern) 83 as shown in FIG. 48 is closely placed, exposed to a ultraviolet ray at 1000 mJ/cm$^2$ and developed with DMDG. Further, it is subjected to a heating treatment at 80° C. for 1 hour, 100° C. for 1 hour, 120° C. for 1 hour and 150° C. for 3 hours to form a solder resist layer 87 (thickness: 20 $\mu$im) opening (opening diameter: 200 $\mu$m) a solder pad portion 85 (including via-hole and its land portion 86), whereby a printed wiring board 88 is produced.

(20) Then, the board 88 provided with the solder resist layer 87 is immersed in an electroless nickel plating solution of pH=5 containing 30 g/L of nickel chloride, 10 g/L of sodium hypophosphite and 10 g/L of sodium citrate for 20 minutes to form a nickel plated layer 89 of 5 $\mu$m in thickness on the opening portions 85, 86 as shown in FIG. 50. Further, the board is immersed in an electroless gold plating solution containing 2 g/L of potassium gold cyanide, 75 g/L of ammonium chloride, 50 g/L of sodium citrate and 10 g/L of sodium hypophosphite at 93° C. for 23 seconds to form a gold plated layer 90 of 0.03 $\mu$m in thickness on the nickel plated layer 89.

(21) Next, a solder paste is printed on the opening portion of the solder resist layer 87 and reflowed at 200° C. to form a solder bump (solder body) 91, whereby there is produced a printed wiring board 92 having solder bumps 91. Moreover, portions of usual wiring (line width: 75 $\mu$m) and fine wiring (line width: 50 $\mu$m) are arranged in the printed wiring board, and further the fine wiring portion is divided into coarse wiring density (distance: 400 $\mu$m) and dense wiring density (distance: 50 $\mu$m).

Peel Test of Solder Resist Layer

With respect to the thus produced printed wiring board, the peeling of the solder resist layer is tested after the formation of the solder resist layer and after reliability test (heat cycle condition). Moreover, the presence or absence of poor continuity between the conductor circuits is compared in coarse and dense portions of the wiring density and the organic residue in the bottom of the opening portion is confirmed. The results are shown in Table 3.

COMPARATIVE EXAMPLE 1

A wiring board is produced in the same manner as in Example 1 except that a copper-nickel-phosphorus roughened layer of 3 $\mu$m in thickness is formed on the surface of the innerlayer copper pattern at the steps (2) and (5) of Example 1 as a roughening method of the innerlayer copper pattern (underlayer conductor circuit). This roughened layer is formed by immersing the board in an electroless plating solution of pH=9 containing 8 g/L of copper sulfate, 0.6 g/L of nickel sulfate, 15 g/L of citric acid, 29 g/L of sodium hypophosphite, 31 g/L of boric acid and 0.1 g/L of a surfactant. With respect to the thus obtained wiring board are made the heating test and heat cycle test in the same manner as in Example 1. The results are shown in Table 1.

COMPARATIVE EXAMPLE 2

A wiring board is produced in the same manner as in Example 1 except that a graphitization-reduction treatment is carried out at the steps (2) and (5) of Example 1 as a roughening method of the innerlayer copper pattern (underlayer conductor circuit). A roughened surface having a depth of 3 $\mu$m is formed by the graphitization-reduction treatment using NaOH(10 g/L), NaClO$_2$(40 g/L) and Na$_3$PO$_4$(6 g/L) as an oxidation bath and NaOH (10 g/L) and NaBH$_4$(6 g/L) as a reduction bath. With respect to the thus obtained wiring board are made the heating test and heat cycle test in the same manner as in Example 1. The results are shown in Table 1.

COMPARATIVE EXAMPLE 3

A wiring board is produced in the same manner as in Example 1 except that a mixed solution of hydrogen peroxide-sulfuric acid is used at the steps (2) and (5) of Example 1 as a roughening method of the innerlayer copper pattern (underlayer conductor circuit). A depth of a roughened surface is 3 $\mu$m. With respect to the thus obtained wiring board are made the heating test and heat cycle test in the same manner as in Example 1. The results are shown in Table 1.

COMPARATIVE EXAMPLE 4

The same procedure as in Comparative Example 1 is repeated except that tin substitution is not carried out. With respect to the thus obtained wiring board are made the heating test and heat cycle test in the same manner as in Example 1. The results are shown in Table 2.

COMPARATIVE EXAMPLE 5

The same procedure as in Comparative Example 2 is repeated except that tin substitution is not carried out. With respect to the thus obtained wiring board are made the heating test and heat cycle test in the same manner as in Example 1. The results are shown in Table 2.

COMPARATIVE EXAMPLE 6

The same procedure as in Comparative Example 3 is repeated except that tin substitution is not carried out. With respect to the thus obtained wiring board are made the heating test and heat cycle test in the same manner as in Example 1. The results are shown in Table 2.

COMPARATIVE EXAMPLES 7 and 8

The same procedure as in Example 16 is basically repeated except that in Comparative Example 7, a roughened surface is formed on the conductor circuit as a surface layer by a graphitization-reduction treatment using NaOH (10 g/L), $NaClO_2$(40 g/L) and $Na_3PO_4$(6 g/L) as an oxidation bath (graphitization bath) and NaOH(10 g/L) and $NaBH_4$(6 g/L) as a reduction bath, while in Comparative example 8, a roughened layer of copper-nickel-phosphorus needle alloy is formed on the conductor circuit as a surface layer with an electroless plating solution of pH=9 containing $3.2 \times 10^{-2}$ mol/L of copper sulfate, $3.9 \times 10^{-3}$ mol/L of nickel sulfate, $5.4 \times 10^{-2}$ mol/L of sodium oxalate, $3.3 \times 10^{-1}$ mol/L of sodium hypophosphite and $1.1 \times 10^{-4}$ mol/L of a surfactant (Surfeel 465, made by Nisshin Kagaku Kogyo Co., Ltd.).

Even in Comparative Examples 1 and 2, usual wiring and fine wiring portions and coarse and dense portions of wiring density are formed likewise Example 1. With respect to these wiring boards, the peel test of the solder resist layer is carried out in the same manner as in Example 16. The results are shown in Table 3.

TABLE 1

|  | Heating test | Heat cycle test |
|---|---|---|
| Example 1 | no peeling<br>change ratio of resistance of 1% | no peeling<br>change ratio of resistance of 5% |
| Example 2 | no peeling<br>change ratio of resistance of 1% | no peeling<br>change ratio of resistance of 5% |
| Comparative Example 1 | no peeling<br>change ratio of resistance of 3% | no peeling<br>change ratio of resistance of 10% |
| Comparative Example 2 | peeling<br>change ratio of resistance of 2% | peeling<br>change ratio of resistance of 8% |
| Comparative Example 3 | peeling<br>change ratio of resistance of 1% | peeling<br>change ratio of resistance of 5% |

As shown in Table 1, when the wiring boards of Examples 1 and 2 are compared with the wiring boards of Comparative Examples 1~3, the peeling between the interlaminar resin insulating layer and the underlayer conductor circuit hardly occurs and the peeling of the via-hole conductor can be controlled even in the heating test and the heat cycle test.

TABLE 2

|  | Heating test | Heat cycle test | Haloing | Peel |
|---|---|---|---|---|
| Example 1 | no peeling<br>change ratio of resistance of 1% | no peeling<br>change ratio of resistance of 5% | absence | 0.6 |
| Example 3 | peeling<br>change ratio of resistance of 1% | peeling<br>change ratio of resistance of 5% | presence | 0.5 |
| Example 4 | no peeling<br>change ratio of resistance of 1% | no peeling<br>change ratio of resistance of 5% | absence | 0.8 |
| Example 5 | no peeling<br>change ratio of resistance of 1% | no peeling<br>change ratio of resistance of 5% | absence | 0.8 |
| Example 6 | no peeling<br>change ratio of resistance of 1% | no peeling<br>change ratio of resistance of 5% | absence | 0.8 |
| Example 7 | no peeling<br>change ratio of resistance of 1% | no peeling<br>change ratio of resistance of 5% | absence | 0.8 |
| Example 8 | no peeling<br>change ratio of resistance of 1% | no peeling<br>change ratio of resistance of 5% | absence | 0.8 |
| Example 9 | no peeling<br>change ratio of resistance of 1% | no peeling<br>change ratio of resistance of 5% | absence | 0.8 |
| Example 10 | no peeling<br>change ratio of resistance of 1% | no peeling<br>change ratio of resistance of 5% | absence | 0.8 |
| Example 11 | no peeling<br>change ratio of resistance of 1% | no peeling<br>change ratio of resistance of 5% | absence | 0.8 |
| Example 12 | no peeling<br>change ratio of resistance of 1% | no peeling<br>change ratio of resistance of 5% | absence | 0.8 |
| Example 13 | no peeling<br>change ratio of resistance of 1% | no peeling<br>change ratio of resistance of 5% | absence | 0.8 |
| Example 14 | no peeling<br>change ratio of resistance of 1% | no peeling<br>change ratio of resistance of 5% | absence | 0.8 |
| Example 15 | no peeling<br>change ratio of resistance of 1% | no peeling<br>change ratio of resistance of 5% | absence | 0.8 |
| Comparative Example 4 | no peeling<br>change ratio of resistance of 3% | no peeling<br>change ratio of resistance of 10% | presence | 0.8 |
| Comparative Example 5 | peeling<br>change ratio of resistance of 2% | peeling<br>change ratio of resistance of 8% | presence | 0.5 |
| Comparative Example 6 | peeling<br>change ratio of resistance of 1% | peeling<br>change ratio of resistance of 5% | presence | 0.4 |

As shown in Table 2, in the multilayer printed wiring boards of Examples 4~15, there is caused no peeling between the interlaminar resin insulating layer and the underlayer conductor circuit even in the heating test and the heat cycle test as compared with the multilayer printed wiring board of Example 3. And also, the change ratio of resistance in via-hole portion of Examples 4~15 is less than those of Comparative examples 2 and 3. Further, in the multilayer printed wiring boards of Examples 4~15, there is not confirmed haloing observed in Example 3 and Comparative examples 4~6. Moreover, the peel strength in the multilayer printed wiring boards of Examples 4~15 is higher than those of Example 3 and Comparative Examples 5 and 6.

insulating layer and the adhesion property between the metal layer and the via-hole conductor even if the metal itself is oxidized.

In the multilayer printed wiring board according to the invention, there can be prevented the lowering of adhesion strength between the roughened surface and the resin insulating layer and the lowering of the adhesion strength between the roughened surface and the via-hole conductor due to the peeling of the oxide film formed on the roughened surface. And also, according to the invention, the haloing is controlled and there can be provided a multilayer printed wiring board having an excellent connection reliability to the via-hole.

As previously mentioned, in the printed wiring board according to the invention, the roughened surface having a

TABLE 3

| Evaluation items | Evaluation portion | Example 16 | Comparative Example 7 | Comparative Example 8 |
| --- | --- | --- | --- | --- |
| Peeling after resist formation *1 | wiring density - coarse | absence | absence | absence |
| | wiring density dense | absence | absence | absence |
| Peeling after heat cycle *2 | wiring density - coarse | absence | presence | absence |
| | wiring density - dense | absence | absence | absence |
| Poor continuity between conductor circuits *1 | wiring density - coarse | absence | absence | absence |
| | wiring density - dense | absence | absence | presence |
| Organic residue *3 | bottom of via-hole | absence | absence | presence |

*1 observed by a microscope (×50)
*2 heat cycle test repetition of 120° C. and −20° C. is made for 100 hours and then the solder resist layer is observed by a microscope (×50).
*3 observed by an electron scanning microscope (×5000)

As shown in FIG. 3, in the printed wiring board of Example 16, there is caused no peeling of resist layer and poor continuity between conductor circuits and the organic residue is not observed. In the printed wiring board of Comparative Example 7, the peeling in the coarse portion of the wiring density is caused after the heat cycle, while in the printed wiring board of Comparative Example 8, the poor continuity between conductor circuits is caused and the organic residue is observed in the bottom of the opening portion.

INDUSTRIAL APPLICABILITY

As mentioned above, in the multilayer printed wiring board according to the invention, the roughened surface having an excellent adhesion property to the resin insulating layer and hardly leaving the resin after the development treatment is formed on the surface of the conductor circuit. In the multilayer printed wiring board according to the invention, the above roughened surface is provided on the surface of the underlayer conductor circuit, so that the peeling between the underlayer conductor circuit and the interlaminar resin insulating layer and the peeling between the underlayer conductor circuit and the via-hole conductor can effectively be controlled in the heating or under heat cycle and the connection reliability to the via-hole can be enhanced.

In the multilayer printed wiring board according to the invention, the roughened surface of the conductor circuit having a given roughening shape is covered with the metal layer made of the non-oxidizing metal or a metal not lowering the adhesion property to the resin insulating layer or the via-hole conductor even if the metal itself is oxidized. Such a metal layer prevents the oxidation of the roughened surface so as not to form oxide film, or does not lower the adhesion property between the metal layer and the resin given shape is formed on the surface of the conductor circuit for solder pad, which is strongly adhered to the solder resist layer through such a roughened surface, so that the sufficient adhesion property between the conductor circuit and the solder resist layer can be ensured when the solder resist layer is removed in the solder bump forming portion to decrease the contact area between the conductor circuit and the solder resist layer, or when the conductor circuit is finer wiring and the wiring density is at a coarse state.

In the printed wiring board according to the invention, the residue of the solder resist forming resin does not remain on the roughened surface exposed in the opening portion for the formation of solder bump and the adhesion property to the metal beneath the solder bump is excellent and the poor continuity is not caused in the solder bump forming portion.

What is claimed is:

1. A multilayer printed wiring board comprising:
   an underlayer conductor circuit;
   interlaminar resin insulating layers formed on the underlayer conductor circuits;
   an upperlayer conductor circuit formed on the interlaminar resin insulating layers;
   wherein the underlayer conductor circuit connect to the upperlayer conductor circuit by way of a via-hole;
   wherein the underlayer conductor circuit has a roughened surface formed by treating the underlayer conductor circuit with an etching solution containing a copper (II) complex and an organic acid;
   wherein the underlayer conductor circuit is comprised of a plurality of anchor portions, recess portions and ridgelines;
   wherein the anchor portions, recess portions and ridgelines are randomly formed on the surface of the underlayer conductor circuit;

wherein adjoining anchor portions are connected to each other through the respective ridgelines;

wherein the recess portions are defined by the anchor portions and ridgelines; and wherein the underlayer conductor circuit is connected to the via-hole through the roughened surface.

2. The multilayer printed wiring board of claim 1, wherein the recess portion has a polygonal shape.

3. The multilayer printed wiring board of claim 1, wherein the ridgeline is branched.

4. The multilayer printed wiring board of claim 1, wherein the ridgeline is sharpened.

5. The multilayer printed wiring board of claim 1, wherein the roughened surface has a maximum roughness of 0.1–10 µm.

6. The multilayer printed wiring board of claim 1, wherein the roughened surface has 2–100 anchor portions and 2–100 recess portions on average per 25 $\mu m^2$.

7. The multilayer printed wiring board of claim 1, wherein the roughened surface is covered with a metal layer made of at least one metal selected from the group consisting of titanium, aluminum, zinc, iron, indium, thallium, cobalt, nickel, tin, lead, bismuth and noble metal.

8. A printed wiring board comprising:

an underlayer conductor circuit;

interlaminar resin insulating layers;

an upperlayer conductor circuit;

an outermost upperlayer conductor circuit for solder pads;

a solder resist layer formed on the outermost upperlayer conductor circuit;

an opening portion formed in the solder resist layer for the arrangement of a solder body;

wherein the outermost upperlayer conductor circuit has a roughened surface formed by treating the upperlayer conductor circuit with an etching solution containing a copper (II) complex and an organic acid;

wherein the outermost upperlayer conductor circuit is comprised of a plurality of anchor portions, recess portions and ridgelines;

wherein the plurality of anchor portions, recess portions and ridgelines are randomly formed on the surface of the underlayer conductor circuit;

wherein adjoining anchor portions are connected to each other through respective ridgelines; and wherein the recess portions are defined by the anchor portions and ridgelines.

9. The printed wiring board of claim 8, wherein the outermost upperlayer conductor circuit has a line width of not more than 50 µm.

10. The printed wiring board of claim 8, wherein the recess portion has a polygonal shape.

11. The printed wiring board of claim 8, wherein the ridgeline is branched.

12. The printed wiring board of claim 8, wherein the ridgeline is sharpened.

13. The printed wiring board of claim 8, wherein the roughened surface has a maximum roughness of 0.1–10 µm.

14. The printed wiring board of claim 8, wherein the roughened surface has 2–100 anchor portions and 2–100 recess portions on average per 25 $\mu m^2$.

15. A method of producing a multilayer printed wiring board comprising:

forming underlayer conductor circuits on a substrate;

forming an interlaminar resin insulating layer on the underlayer conductor circuits;

treating the underlayer conductor circuits with an etching solution containing copper (II) complex and an organic acid to roughen a surface on the underlayer conductor circuit;

covering the roughened surface with a metal layer made of at least one metal selected from the group consisting of titanium, aluminum, zinc, iron, indium, thallium, cobalt, nickel, tin, lead, bismuth and noble metal; and forming an interlaminar resin insulating layer on the metal layer.

16. The method of claim 15, further comprising:

forming an opening portion in the interlaminar resin insulating layer;

forming an upperlayer conductor circuit on the interlaminar resin insulating layer; and connecting the metal layer and the upperlayer conducting circuit to each other through a via-hole.

\* \* \* \* \*